United States Patent [19]
Janko

[11] Patent Number: 6,031,751
[45] Date of Patent: Feb. 29, 2000

[54] SMALL VOLUME HEAT SINK/ELECTRONIC ASSEMBLY

[75] Inventor: Steven P. Janko, Chesterland, Ohio

[73] Assignee: Reliance Electric Industrial Company, Milwaukee, Wis.

[21] Appl. No.: 09/292,075

[22] Filed: Apr. 14, 1999

Related U.S. Application Data

[63] Continuation-in-part of application No. 09/164,090, Sep. 30, 1998, Pat. No. 5,930,135, which is a continuation-in-part of application No. 09/009,441, Jan. 20, 1998, Pat. No. 5,872,711.

[51] Int. Cl.[7] .............................. H02M 1/00; H05K 7/20; H02K 9/00
[52] U.S. Cl. .......................... 363/144; 310/64; 64/259.2; 165/104.33
[58] Field of Search ................................ 363/144; 310/54, 310/58, 64; 165/104.33; 62/259.2

[56] References Cited

U.S. PATENT DOCUMENTS

| | | | |
|---|---|---|---|
| 5,365,424 | 11/1994 | Deam et al. | 363/144 |
| 5,517,063 | 5/1996 | Schantz, Jr. et al. | 307/9.1 |
| 5,521,811 | 5/1996 | Levran et al. | 363/144 |
| 5,523,640 | 6/1996 | Sparer et al. | 310/64 |
| 5,579,217 | 11/1996 | Deam et al. | 363/144 |
| 5,623,399 | 4/1997 | Ishii et al. | 363/132 |
| 5,844,333 | 12/1998 | Sheerin | 310/52 |
| 5,872,711 | 2/1999 | Janko | 363/144 |
| 5,930,135 | 7/1999 | Janko | 363/144 |

*Primary Examiner*—Adolph Deneke Berhane
*Attorney, Agent, or Firm*—Michael A. Jaskolski; John J. Horn; John M. Miller

[57] ABSTRACT

A heat sink apparatus including a fluid conduit within a body portion wherein the body portion including at least one body member linked to the fluid conduit and forming at least first and second walls which are in different planes, the walls forming at least a first mounting surface for mounting heat generating devices.

35 Claims, 16 Drawing Sheets

(METHOD #1)

(METHOD #2)

SMALL VOLUME HEAT SINK/ELECTRONIC ASSEMBLY

CROSS-REFERENCE TO RELATED APPLICATIONS

This application is related to my co-pending application assigned to the same assignee entitled "Low Impedance Contoured Laminated Bus Assembly and Method for Making Same" and is a continuation in part of my application entitled "Heat Sink Apparatus and Method for Making the Same" which was filed on Sep. 30, 1998, has been granted Ser. No. 09/164,090 now U.S. Pat. No. 5,932,135 and which is a continuation-in-part of my application entitled "Heat Sink Apparatus and Method for Making the Same" which was filed on Jan. 20, 1998 and has been granted Ser. No. 09/009,441 now U.S. Pat. No. 5,872,711, which is also assigned to the same assignee as this application.

STATEMENT REGARDING FEDERALLY SPONSORED RESEARCH OR DEVELOPMENT

Not applicable.

BACKGROUND OF THE INVENTION

The present invention relates to the art of heat sinks and cold plates. It finds particular application in conjunction with electronic circuitry used in industrial variable-speed electric motor drives and will be described with particular reference thereto. However, it will be appreciated that the present invention will also find application in conjunction with other electronic devices including non-industrial electronic devices and in any other application which requires a heat transfer or exchange. As an example, the present invention is well suited for the automotive industry where the cooling of electronic and other heat generating components under the hood of an automobile is carried out using readily available refrigerant or radiated closed-loop engine water coolant in conjunction with the invention. Also, the present invention is applicable to provide a specialized electric motor housing adapted to circulate a cooling fluid through the motor casing.

It is well known that variable speed drives of the type used to control industrial electric motors include numerous electronic components. Among the various electronic components used in typical variable-speed drives, all generate heat to a varying degree during operation. Typically, high-power switching devices such as IGBTs, diodes, SCRs, capacitors and the like are responsible for generating most of the heat in a variable-speed drive. It is for this reason, therefore, that most variable-speed drives include a heat sink(s) upon which the power switching devices are mounted. The heat sink(s) conducts potentially damaging heat from those components.

Selecting the size and design of a heat sink for a particular variablespeed drive is somewhat of a challenge. First, a designer must be aware of the overall characteristics of the motor and drive pair. Next, the designer must understand the industrial application into which the motor and drive pair will be used, including the continuous and peak demands that will likely be placed on the motor and drive by the load. Third, the designer must accommodate, in the design, certain unexpected conditions that would deleteriously affect the heat transfer capability of the heat sink such as unexpectedly high ambient temperatures, physical damage to the heat sink such as mechanical damage, or a build up of a debris layer, as examples. Lastly, the heat sink(s) must be physically dimensioned so as to fit into the space allotted per customer requirements cabinet or enclosure size, or the like.

In the past, air-cooled heat conducting plates were used to transfer thermal energy from electronic parts to the ambient air. These were passive heat-transfer devices and were generally formed of a light-weight aluminum extrusion including a set of fins. As a general rule, heat transfer effectiveness is based on the temperature differential between the power devices and the ambient air temperature. Of course, in order to provide adequate heat conduction, heat sinks of this type oftentimes are necessarily large and, therefore, bulky and expensive. If high ambient conditions exist, the heat sink becomes ineffective or useless as heat removal cannot be accomplished regardless of the size of the heat sink. If the variable speed drive was in an enclosed space the heat removed from the drive would need to be exhausted or conditioned for recirculation.

By forcing air over fins defined on the heat-conducting plate or aluminum extrusion, improved cooling efficiencies were realized. Large blower motors are often used for this purpose. However, as the fins defined in the aluminum extrusions become dirty or corroded during use, the heat sinks become less effective or useless altogether. Blower motors cannot be used in environments where air cleanliness would clog filtration. Therefore, air conditioning equipment is often added to internally circulate and cool the air that is passed over the heat sink fins.

Independently cooled cold plates have also been used for some applications but with limited success. Because of their cost, both in the construction of the cold plate itself and in the additional peripheral support apparatus required such as fluid pumps, conduits and the like, heat sinks of this type are typically used only in applications which require a critical degree of control over the temperature of the electronic drive components or where ambient air temperature is excessive.

Once such independently cooled cold plate system is described in U.S. Pat. No. 5,523,640 to Sparer, et al. The Sparer, et al. '640 patent teaches a cooling system which circulates a liquid coolant through a plurality of specialized motor housings and through a cold plate providing on one side a mounting surface for electronic drive components. The multiple motors in the Sparer, et al. '640 system are provided with a housing having an integral heat exchanger. The various electronic components forming the motor drives are mounted to the surface of a chill plate. A housing structure which typically resembles a box and which encloses the electronic components is provided to protect the components. The heat exchangers in the motors are formed by casting stainless steel tubing into a cylindrical aluminum stator housing. Similarly, the chill plate is made of stainless steel tubing cast into an aluminum plate-type heat exchanger.

While the Sparer, et al. '649 system is a marked improvement over forced air type heat exchangers, such independently cooled cold-plate heat exchangers are difficult and costly to produce repeatably. This is due mainly to the inescapable requirement to use stainless steel tubing rather than copper tubing in the aluminum casting process. Stainless steel is better able to withstand the molten aluminum. However, stainless steel is difficult to bend and machine. Stainless steel is also expensive. Bending may require annealing of material which weakens the tubing construction. The weakened annealed areas are prone to aluminum "blow through." Stainless Steel will also develop surface corrosion when exposed to typical coolant chemicals or chemical compounds which attack the steel's passive protective surface. This corrosion reduces the steel's ability to dissipate heat.

However, as those skilled in the art would appreciate, stainless steel tubing is used in chill plate construction because it is one of the few materials able to withstand exposure to molten aluminum and other similar molten metals in a mold without normally developing "blow holes" during the casting process. As the holes develop in metals other than stainless steel, they permit molten pour material to enter the tubing where it solidifies forming a blockage. This renders the heat sink useless. Blow holes do not normally form in standard temper stainless steel tubing because it does not alloy with molten aluminum. Also, the liquidus of stainless steel is much greater than the liquidus of aluminum.

Although it would be desirable to use tubing formed of a material other than stainless steel, attempts to repeatably manufacture aluminum or copper heat sinks using aluminum or copper tubing have heretofore failed. Prior to the present invention, casting with copper tube in an aluminum plate had been attempted but could not be repeated for production purposes due to the above described alloying difficulties. In the past those attempting to cast copper tube in aluminum have had yield rates of one out of ten or 10%.

In addition to alloying and associated blow through problems, copper tubing can also, under certain circumstances, produce dangerous conditions during a molding process. For example, at a specific temperature copper is known to re-crystallize (i.e. change its crystalline structure). Upon recrystallization copper gives off a gas during an "outgassing" process. In the case of a sealed mold form, trapped heated gas expands and increases form pressure. If form pressure exceeds a peak form pressure, the form and molten metal therein has been known to explode causing a bomblike effect sending molten metal and form shrapnel in all directions. Obviously a pressure filled form presents a dangerous situation. Therefore, for this reason also, copper tubing has been avoided in sealed molding processes.

Moreover, while copper tubing can be manipulated more easily than stainless steel, some tubing configurations such as tight tubing radii cannot be provided via tube manipulation. Tight radii has to be provided by either constructing special tube forming equipment (i.e. a special extruder) or by securing prefabricated conduit components (i.e. elbows, "T" sections, straight sections, etc.) together. Special equipment is prohibitively expensive.

While prefabricated conduit components can be brazed together to form a suitable conduit construct, brazed joints have at least one primary disadvantage. Copper-zinc and copper-sliver are typical brazing compounds. After a brazing compound hardens and secures adjacent components together, like copper tubing, brazing compound alloys with molten aluminum and out gasses when a specific temperature is exceeded. The brazing compound, unfortunately, alloys with aluminum at a lower temperature than the copper tubing. In addition, the brazing compound out gasses at a lower temperature than the copper tubing. Thus, when a conduit construct is formed via brazing, the yield rate is further reduced by increased blow through and the possibility of a form explosion is increased due to additional compound outgassing.

With respect to stainless steel, stainless steel tubing is not only difficult to work, as discussed above, but its thermal resistance is higher than aluminum or copper. The stainless steel tubing string in an aluminum or copper casting acts as a thermal insulator as compared to the heat transfer characteristics of the aluminum or copper forming the heat sink body. It would be desirable to use a tubing material having thermal transfer characteristics that match the aluminum or copper forming the body of the heat sink. It would be preferred to use aluminum or copper tubing in an aluminum or copper heat sink. Attempts to repeatedly manufacture such heat sinks have heretofore failed.

Much development has occurred in design of specially formed and/or machined tubing to increase its heat transfer capability. Tubing has been manufactured in various forms to increase heat removal by increasing flow turbidity and cross-sectional area. As an example, "gun barrel" type tubes and knurled tubes have been used. In the past, attempts to cast these type tubes in aluminum or copper heat sink bodies have generally failed as well. The present invention is the only known method for repeatably casting such tubing forms with high yield rates.

An additional limitation of prior independently cooled cold plates such as the system taught in the Sparer, et al. '640 patent discussed above is the heat absorption capacity of the coolant fluid. Typically, the fluid used is water or a glycol water solution. In heavy industrial applications, the cooling water is typically circulated between the heat sink and an auxiliary heat exchanger such as a liquid/liquid-type unit. The auxiliary heat exchanger is usually connected to a source of tap water or to a central water chiller. This additional heat exchange equipment is costly, complicated, requires periodic maintenance, and is prone to failure.

With any type of cold plate design tube spacing is extremely important for a number of reasons. First, as a general rule heat dissipation is a function of how close tubes are to the surfaces of a heat sink and more specifically how close the tubes are to the heat absorbing surfaces.

Second, where similar devices which generate similar amounts of heat are mounted to a cold plate surface, to ensure essentially even heat dissipation the tubes must generally be equispaced within the plate.

Third, where different devices which generate different amounts of heat are mounted to a cold plate surface, to dissipate different amounts of heat at different locations on the plate, the tubes must be differently spaced in different portions of the plate. For example, where power devices give off more heat than capacitors, relatively more tube length should be formed within a plate portion adjacent the power devices than in the plate portion adjacent the capacitors.

Fourth, where electronic devices are to be attached to a heat sink via bolts received in holes, it is extremely important that, during hole placement, tube location be precisely known. If tube placement is unknown, a bolt hole may be provided which enters a tube and thereby renders the sink assembly inoperable.

Fifth, other machining may trim the thickness of a wall after molten sink material cures. In this case, if tube position is not precisely known, the machining may form a relatively thin wall adjacent a tube or, in fact, may enter a tube.

Unfortunately, while precise spacing is important, often, during heat sink formation, spacing cannot be precisely maintained. While stainless steel can be formed into relatively rigid serpentine tubes prior to providing molten sink material therearound, when molten material is added to a sink mold, the material tends to force the tubes vertically and, in some cases, horizontally, within the mold cavity. This movement changes the position of the tubes with respect to each other and with respect to the finished sink surfaces.

While tube movement is problematic even in the case of stainless steel tubes which are relatively rigid, it is likely that such movement would be exacerbated in the case of tubes formed of a softer and less rigid material such as copper or aluminum.

One attempt to ensure tube spacing during mold formation is described in U.S. Pat. No. 5,484,015 which is entitled "Cold Plate and Method of Making Same" which issued on Jan. 16, 1996. That patent teaches the use of tie bars which are used to maintain the vertical spacing of tubes within a sink during a molding process. To this end, adjacent tubes are stacked together (i.e. touch each other) and tie bar is secured therearound. In this configuration there is no space between the stacked tubes. Top and bottom portions of the tie bar serve as vertical spacers for the tubes when the tube assembly is placed within a mold cavity.

Unfortunately, while the tie bars described in the '015 reference can in fact maintain vertical spacing between mold surfaces and adjacent tubes, the bars cannot maintain either horizontal tube positions or positions of tubes with respect to other tubes. For example, the reference does not teach how to, within a sink wall, maintain a one inch space between first and second tubes or a one inch space between each tube and all adjacent wall surfaces.

Although most electronic devices generate heat from virtually all device surfaces, devices are typically designed to generate most heat from a single device surface. For the purposes of this explanation the surface of each device which generates the most heat will be referred to hereinafter as a dissipating surface.

Prior art cold plates have included electronic devices secured along their dissipating surfaces to only a single cold plate mounting surface. Mounting to a single mounting surface has the advantage that all device input and output connections are exposed in proximity to each other. In addition, by limiting devices to single mounting surface, the opposite plate surface can be used to mount the plate and device assembly to some type of support mechanism (e.g. a wall or the like). With devices arranged on a single mounting surface, the mounting surface area required to mount the devices is equal to the combined surface area of all the device dissipating surfaces plus some clearance area between adjacent devices.

Unfortunately, while mounting to a single mounting surface has certain advantages, such a configuration can result in an overall assembly which requires a relatively large volume. This is particularly true where electronic devices have disparate shapes and sizes.

For example, as well known in the motor controls art, to configure a motor drive to store DC voltage and then convert the DC voltage to variable AC voltage, two general device types are required including (1) storage capacitors for storing the DC voltage and (2) some type of power switching devices (e.g. IGBT, BJT, GTO, etc.) for converting the DC voltage to variable AC voltage. While a motor control assembly typically includes six switching devices and a large number (e.g. 36) of capacitors, in order to explain how devices which are mounted to a single plate surface result in assemblies which require large volumes, it will be assumed that a configuration includes only one capacitor and one switching device.

Capacitor and switching device shapes are typically very different. Referring to FIG. 11, a plate assembly A1 including a single capacitor C and a single switching device S which are mounted to a single mounting surface 207 of a plate P is illustrated. Capacitor C shape is generally elongated and cylindrical, having a length Lc and a width Wc, and each capacitor has a single relatively small dissipating end surface 205. To facilitate maximum heat dissipation the capacitor's heat dissipating surface 205 is mounted to a cold plate mounting surface 207.

Unlike a capacitor, most switching devices S have a generally flat configuration having a thickness Ts. The largest surface of a switching device S is usually the dissipating surface 209 which has a length Ls (not illustrated) and a width Ws. Typically each of length Ls and width Ws is much greater than thickness Ts. The switching device dissipating surfaces 209 are mounted to the mounting surface to facilitate maximum heat dissipation.

Referring still to FIG. 11, plate P has a thickness Tp. A simple housing H is provided to protect capacitor C and device S. The total volume V1 required for assembly A1 is:

$$V1=(Lc+Tp)(Wc+Ws)(Da) \quad (1)$$

where Da is assembly depth into FIG. 11 (e.g. where assembly A1 is one device deep, Da may be either device S length Ls or capacitor C width Wc). Clearly, a large volume Vw between device S and adjacent portions of housing H is unpopulated (i.e. has no device located therein) and therefore, that volume $V_w$ is wasted.

One way to reduce the volume V1 required for assembly A1 would be to provide a relatively complex housing structure which conforms to the shapes defined by the mounted capacitor C and device S. Unfortunately, such a housing would be relatively expensive to configure as various contorted shapes would have to be accommodated. In addition, where another capacitor is added to FIG. 11 adjacent device S and on a side opposite capacitor C (i.e. to the right of device S), the complexity of a volume saving housing would be exacerbated and not very effective in any event.

While wasted volume Vw in simple configuration A does not seem appreciable, the wasted volume increases as additional devices are added to the assembly. For example, as additional devices are added to assembly A1, volume V1 increases by at least the area of the dissipating surface of the added device times capacitor length Lc. The additional wasted volume is appreciable.

Moreover, where an assembly A1 includes a large number of devices mounted to a single surface, the shape of the housed assembly often has a relatively large footprint (i.e. width and length sufficient to accommodate all dissipating surface areas plus clearance between devices). While an assembly having such a large footprint may be acceptable in some applications, such an assembly will often be prohibitively large for use in other applications. For example, in an electric vehicle where space is limited and often has contoured boundaries, assemblies having large footprints often cannot be accommodated.

Yet another problem with cold plate designs is that the relatively long serpentine tube required to guide coolant through the plate impedes fluid flow therethrough to some extent. For this reason, often relatively large pumps are required to ensure sufficient pressure to pump the coolant through the tube.

One solution which would reduce tube impedance and thereby facilitate use of a relatively small pump would be to provide a manifold which splits coolant flow into several different paths through the plate thereby reducing tube pressure. This solution has been avoided for a number of reasons. First, to link an inlet tube to a manifold and, perhaps to form the manifold itself would require brazing together two or more different tube sections. With respect to stainless steel, brazing is an extremely difficult process which requires a large amount of skill.

While brazing aluminum and cooper components together is easier than brazing stainless steel components together, as indicated above, there has never been an effective way to form a sink about such tubing successfully. In addition, it should be noted that, even if a sink could be formed using copper or aluminum tubing, generally, the industry has viewed such brazed joints as unsafe.

Therefore, it would be advantageous to have an apparatus which could be used during a sink molding process to maintain both the horizontal and vertical positions of sink tubing, to have a sink which requires a relatively small pump and provide a sink and associated electronic components which together require a relatively small volume.

BRIEF SUMMARY OF THE INVENTION

In accordance with one aspect of the invention, an improved heat sink is provided which includes a copper tubing string in a cast aluminum main body member. In accordance with another aspect of the invention, an improved heat sink is provided which includes an aluminum tubing string in a cast aluminum main body member.

In yet another aspect of the invention, an improved heat sink is provided which includes a copper tubing string disposed in a cast copper main body member.

In still yet another aspect of the present invention, an improved heat sink is provided which includes an aluminum tubing string disposed in a cast copper main body member.

In accordance with still yet another aspect of the present invention, an improved refrigerant compressor motor and drive system is provided which includes a heat sink for mounting electronic components of the drive system thereon. The heat sink is adapted to circulate a compressed liquid refrigerant therethrough and includes a tubing string formed preferably of copper or perhaps of aluminum material cast in a main body member formed of either copper or aluminum. The heat sink provides a vibrationally stable support unit or structure for the various electronic drive components.

In accordance with yet another aspect of the invention, an improved variable-speed drive system is provided which includes a heat sink for mounting electronic components of the variable speed drive system thereon. The heat sink provides vibrational stability to the electronic drive components and, further, is adapted to circulate chilled oil from the application therethrough and includes a tubing string formed of either a copper or aluminum material cast into a main body member formed of either copper or aluminum.

In yet another aspect of the present invention, an improved variable-speed drive system is provided which includes a heat sink for mounting electronic components of the variable-speed drive system thereon. The heat sink provides vibrational stability to the electronic drive components and, further, is adapted to circulate chilled water from the application therethrough and includes a tubing string formed of either a copper or aluminum material cast into a main body member formed of either copper or aluminum.

In accordance with still yet further another aspect of the present invention, an improved method for making a heat sink is provided. The method includes the step of filling an aluminum or copper tubing string with sand, disposing the sand-filled tubing string in a mold cavity, pouring a molten aluminum or copper material into the mold cavity, and permitting the molten aluminum or copper material to solidify.

In accordance with yet another aspect of the present invention, a second method for making a heat sink is provided. The method includes the steps of providing a copper or aluminum tubing string, preparing the outer surface of the tubing string to accept a coating material, coating the prepared surface of the copper or aluminum tubing string with a binder material, preferably including graphite, baking the binder coated tubing string at a predetermined temperature for a predetermined time, placing the cured binder coated structure into a mold cavity or die cavity, and pouring molten aluminum or copper into the mold cavity and permitting the molten material to cool and solidify.

While the preferred binder material includes some graphite, other binder materials are possible. The important characteristics of the binder material are that the material prohibit alloying between the materials used to form the tubing and the body portion of a heat sink at the pouring temperature of the body portion material and that the material be thermally conductive. To this end, another possible binder material is a nickel compound. Other binder materials may be nickel-electroplating or a nickel-maganese compound. The advantage of using nickel is that the nickel acts as an outgassing barrier or "skin" blocking gas formed during re-crystallization of a copper tube or conduit construct. The nickel skin stops gas from entering a mold form during a molding process and therefore appreciably reduces the likelihood of form explosion. In the case of a one-shot form (i.e. disposable sand mold form), form gas is reduced to an acceptable level wherein explosion is not a concern. This is because some form trapped gas can escape through the porous sand mold form thereby reducing form pressure. In the case of a permanent steel mold (i.e. a "perm-mold"), other sources of form gas may still prohibit safe use but, in some cases, a thick enough barrier material layer may render perm-molding possible.

One advantage of the present invention resides in the improved thermal cooling of electronic devices mounted to a surface of the heat sink.

Another advantage of the present invention resides in the improved ease of manufacture of the heat sink.

Still yet another advantage of the present invention is that the heat sink itself is formed into a shape to provide a housing unit for mounting the various components comprising an electric motor drive or any other electronic hardware or system applications. When used in this manner, the housing formed by the heat sink body provided a vibrationally stable mounting structure.

Yet a further advantage of the invention is that the graphite used in the binder material is both thermally and electrically conductive. Other coatings such as copper oxides or epoxies form an insulating layer between the copper tubing string and the heat sink body resulting in electric dissociation of the copper due to electrolysis. In the present invention the graphite provides a charge bleed path to dissipate the charge from ionized cooling fluid to ground through the graphite and heat sink body.

In one embodiment, instead of providing a serpentine, single path tube through a sink body portion, a spreader is provided within the body portion between the inlet and the outlet of the tube, provides at least two, and preferably several, different paths throughout the body portion. When the tube is so configured, tube pressure is substantially reduced as the cross sectional area of the passageway formed by the spreader is greater than the cross sectional area of the inlet and outlet tubes. For this reason, a reduced size pump can be used to cool the sink and electronic components mounted thereon.

To form the spreader, the inventive method also includes brazing different tube assembly components together, preferably, using a copper-zinc or copper-silver compound. When the body portion is formed about the tube assembly, the body portion encases each of the brazed joints.

Thus, an object of the invention is to provide a sink wherein the tube assembly can be formed by brazing different tube components together wherein the brazed joints are supported sufficiently to withstand excessive pressure. To this end, when the brazed joints are encased in the body portion, the brazed joints are supported for guiding high pressure liquid the reth rough.

According to another aspect of the invention, a preferred method includes the steps of disposing the first portion (excluding the ends) of a tube assembly within the a mold cavity such that the first portion is suspended vertically and horizontally from all mold cavity surfaces and, prior to the step of introducing molten body portion material into the cavity, providing a supporter within the mold cavity for maintaining the first portion position during the introducing step. Preferably the supporter is a lattice structure which is constrained by the mold cavity and which contacts the first portion. Preferably, the step of providing the lattice structure includes forming the lattice structure of a third metal and, prior to the step of introducing, the method also includes the step of coating the lattice structure with a binder material, the binder material operating as a barrier to alloying between the third and second materials and being thermally conductive.

Thus, one other object of the invention is to provide a structure for limiting both vertical and horizontal movement of a tube assembly within a sink mold cavity during introduction of molten material thereinto. To this end the structure described above and in more detail below constrains assembly movement.

Another object of the invention is to maintain the spatial orientation of adjacent tube sections during introduction of molten material into a cavity. To this end, the lattice structure can be rigid between adjacent tube sections such that relative position is maintained.

The invention also includes the general concept of providing an electronic assembly which includes at least first and second linked heat sink walls which are in different planes and electronic devices attached to each wall. It has been recognized that when electronic devices having disparate shapes are mounted to a single planar heat sink, the resulting assembly requires a relatively large volume due to housing design constraints and other practical limitation (e.g. size of a volume required to be useful). By taking device dimensions into account when designing a sink reduced volume packages can be formed. Such design types can be divided into two different types referred to generally as parallel alignment and stacked alignment types.

In parallel alignment designs, a sink is provided such that long dimensions of devices can be aligned in parallel. This can be accomplished by providing a sink including at least first and second walls which define first and second mounting surfaces and wherein the second wall is essentially perpendicular to the first wall. Then, devices which have their long dimension perpendicular to a heat dissipating surface are mounted on the first mounting surface adjacent the second wall and devices which have their long dimension along a heat dissipating surface are mounted on the second mounting surface.

In stacked alignment designs short dimensions of a first device type are aligned with long dimensions of a second device type, but two or more of the second device type are stacked on opposite sides of a heat sink wall adjacent the first device type and so that their short dimensions are parallel to the long dimension of the first device type. This can be accomplished by providing a sink wherein first and second walls are essentially parallel, the first wall defines a first mounting surface and the second wall defines second and third oppositely facing mounting surfaces, devices having a long dimension perpendicular to a heat dissipating surface are mounted to the first surface, devices having a long dimension parallel to a heat dissipating surface are mounted to the second and third mounting surfaces and the short dimensions of the devices mounted to the second and third surfaces are essentially parallel and adjacent the long dimension of the devices mounted to the first mounting surface.

Generally, in this regard, the invention includes an electronic brick assembly comprising a heat sink assembly including a metallic main body portion, the main body portion including at least a first wall member and a second wall member which is linked to the first wall member, the first and second wall members linked such that the walls are disposed in first and second different planes, respectively. The assembly further includes an elongate conduit construction which forms a passageway between first and second construction ends, the construction disposed in the body portion such that a portion of the construction is disposed in the first wall member and a portion of the construction is disposed in the second wall member, the first and second ends extending from the body portion. The assembly further includes at least a first electronic device linked to the first wall member and at least a second electronic device linked to the second wall member to facilitate device heat transfer to the first and second wall members, respectively.

In one embodiment the assembly is a power brick assembly controllable to provide AC voltage to a motor, the first device includes a plurality of voltage storage devices for storing DC voltage for driving the motor and the second device includes a plurality of inverter switching devices, the inverter devices linked to the storage devices and controllable to convert the DC voltage to AC voltage for driving the motor. Also, the assembly may include rectifier switches which are linked to one of the wall members for transferring heat thereto, the rectifier switches linkable to AC power supply lines for receiving AC voltage and controllable to converter the AC voltage to DC voltage across the storage devices.

In addition to parallel and stacked alignment designs, a third useful design includes devices secured to opposite sides of a single, plate-like heat sink design. By placing devices on both sides of a liquid cooled heat sink essentially all of the useful surface area of the heat sink is used to dissipate heat. In this case a housing is preferably formed about devices on each side of the sink.

Preferably, where devices to be secured to a planar sink wall can be grouped generally into a first sub-set including devices having a long dimension perpendicular to a heat dissipating surface and a second sub-set including devices having a long dimension along a heat dissipating surface, first sub-set devices are mounted on a first mounting surface and second sub-set devices are mounted on a second mounting surface opposite the first mounting surface. In this manner a particularly small device/heat sink configuration is achieved.

Moreover, where a conduit construct for guiding cooling liquid includes a manifold having a plurality of conduits extending therefrom and the manifold has dimensions which are substantially larger than the dimensions of each conduit linked thereto, the manifold may be placed inside a first sink wall and the conduits linked thereto may be placed in a second sink wall adjacent the first wall so that the first wall extends to a first side of the second wall. In this case, heat generating devices may be mounted on the first side of the second wall extending therefrom in the same direction as the first wall to reduce required space.

Furthermore, it has been recognized that a liquid cooled sink which includes a conduit construct arranged in at least first and second non-parallel planes is advantageous irrespective of the type of material used to form the conduit and the sink body therearound and irrespective of the body member configuration formed about the conduit construct. Thus, in one aspect the invention includes a multiplanar conduit construct including first and second construct sections in first and second different planes, respectively, having any one of the following characteristics:

(1) only construct ends (i.e. an inlet and an outlet) are exposed;
(2) excluding construct ends, the first and second construct sections are encased and conduit sections between the first and second sections are exposed;
(3) a sink body member is mounted to only a fore side of the first construct section, the aft side being exposed, irrespective of the characteristics of the body member mounted to the second construct section;
(4) sink body members are mounted to only fore sides of each of the construct sections, aft sides of the construct sections exposed;
(5) separate pairs of sink body members sandwich each of the first and second construct sections and form mounting surfaces for heat generating devices;
(6) a pair of sink body members sandwich the first construct section irrespective of the characteristics of the body member corresponding to the second construct section; etc.

Also, the inventive sink design is not limited to having only two construct sections but, rather, may include three or more construct sections in different planes.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefor, to the claims herein for interpreting the scope of the invention.

DETAILED DESCRIPTION OF THE INVENTION

Figure 1:
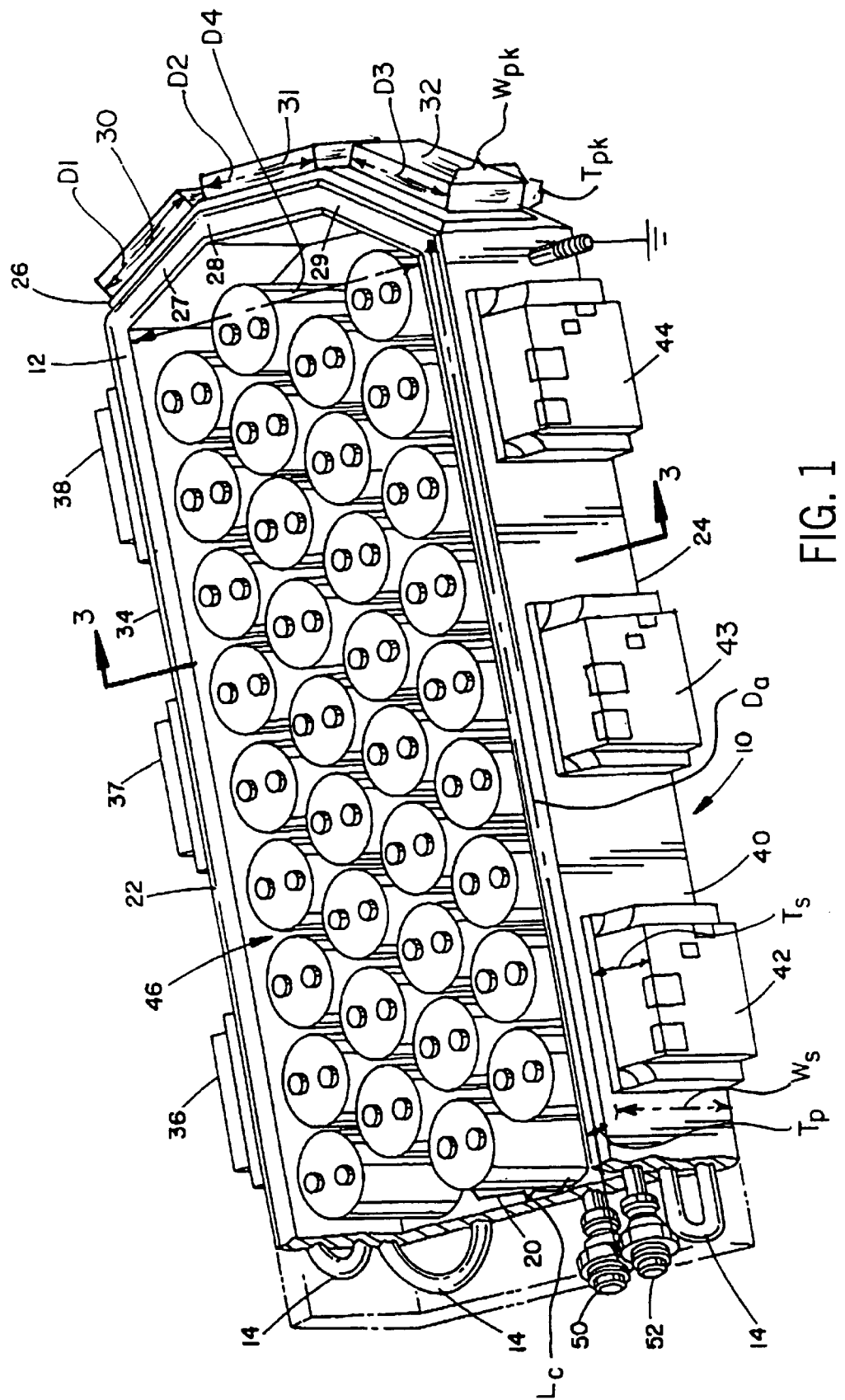
FIG. 1 is a perspective view of an inventive sink assembly showing a parallel alignment type sink with an end portion of a casting removed exposing the internal tubing.
Figure 2:
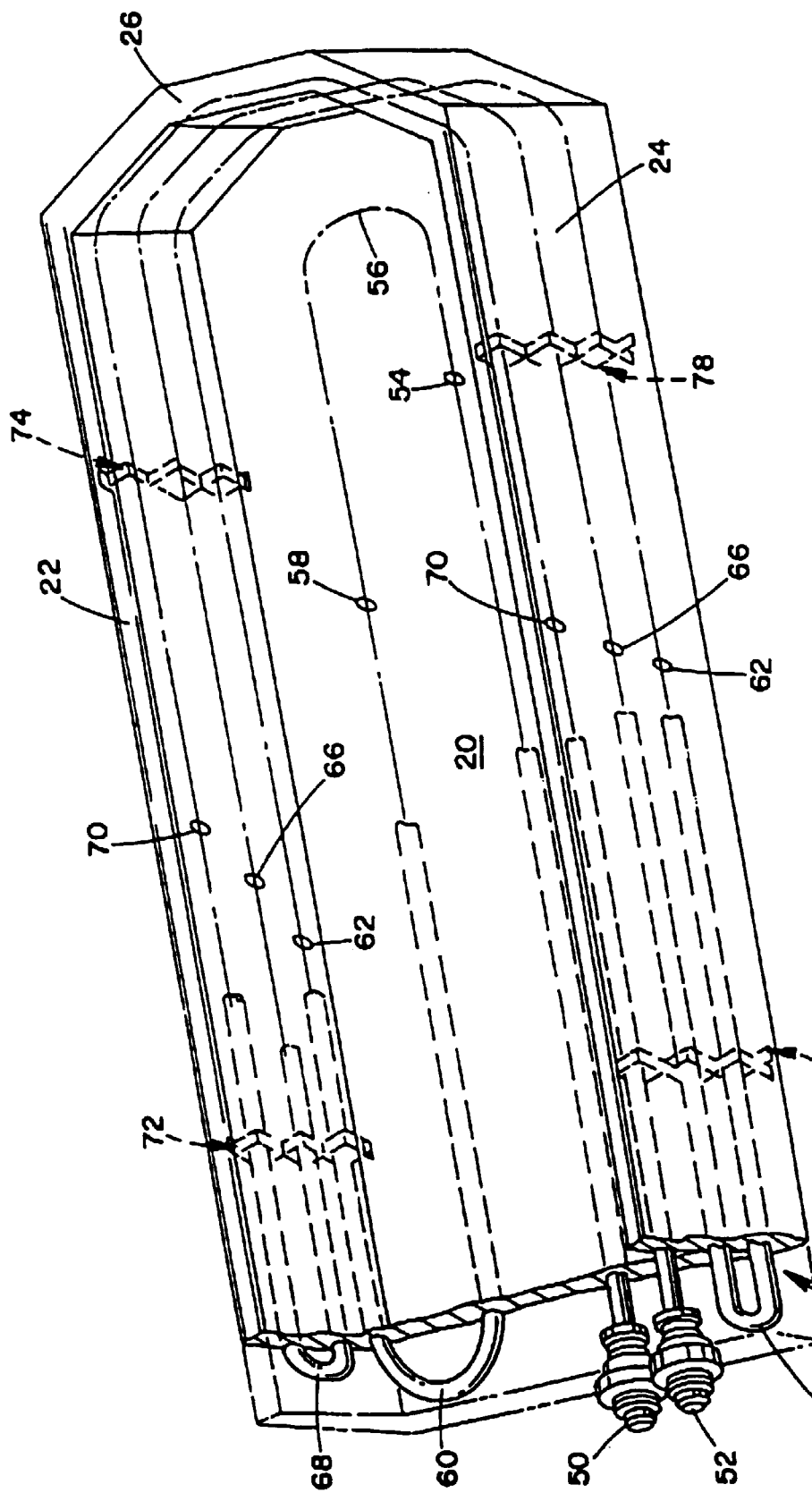
FIG. 2 is an isometric perspective view of the heat sink shown in FIG. 1 with the tubing string illustrated partially in phantom lines.
Figure 3:
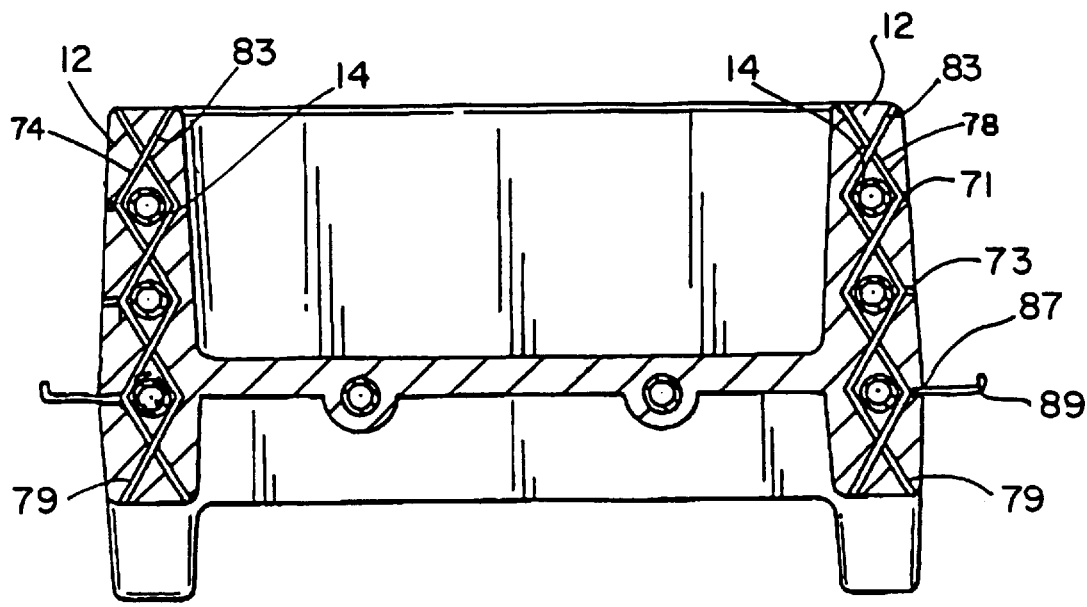
FIG. 3 is a cross-sectional view of the heat sink of FIG. 1 taken along the plane of line 3—3 of FIG. 1.

With reference to FIGS. 1–3, a heat sink assembly 10 includes a main body portion 12 and a conduit construct or tubing string 14 cast into the main body portion 12. The main body portion 12 is formed to define a substantially planar base portion 20, left and right vertical side walls 22, 24 and a vertical end wall 26. In the preferred embodiment illustrated, the vertical end wall is divided into a set of intersecting planar regions 27–29 which are adapted to receive semiconductor power package devices 30–32 thereon as illustrated. The side walls are likewise adapted to receive a set of power semiconductor switching devices. In the preferred embodiment shown, the semiconductor power package devices 30–32 and the power switching devices 36–38 and 42–44 are SCRs and IGBTs, respectively. The semiconductor power package and switching devices comprise part of a variable speed inverter motor drive including a contoured laminated bus bar formed in accordance which my copending application filed concurrently with this application and assigned to the game assignee entitled "Low Impedance Contoured Laminated Bus Assembly and Method for Making Same" the teachings of which are incorporated herein by reference.

The outside surface 34 of the left vertical side wall 22 is adapted to receive a set of semiconductor switching devices 36–38 as illustrated. Preferably, the semiconductor switching devices 36–38 are evenly spaced apart over the outside surface 34 of the left vertical side wall 22. This assists in an even thermal load distribution over the left vertical side wall 22. Similarly, the outside surface 40 of the right vertical side wall 24 is adapted to receive a second set of semiconductor switching devices 40–44 as illustrated. The second set of semiconductor switching devices 42–44 are also preferably evenly distributed over the outside surface 40 of the right vertical side wall 24.

Lastly, in connection with the mounting of variable-speed drive electronic components, the substantially planar base portion 20 of the heat sink assembly 10 is adapted to receive a set of high-voltage capacitors 46 evenly arranged in rows and columns as illustrated.

It is to be noted that the various electronic components disposed on the heat sink assembly 10 as described above, namely the semiconductor power package devices 31–32, the first set of semiconductor switching devices 36–38, the second set of semiconductor switching devices 42–44, and the set of high-voltage capacitors 46 comprise what is commonly referred to in the art as the "power section" of an industrial motor drive. Typically, the power section of an industrial drive generates a substantial amount of heat as compared to the other electronic subassemblies comprising an industrial variable-speed drive. In its preferred form, the power section includes capacitors 46 of the type having threaded stud members extending into the base portion 20 and thermally and electrically connected to the heat sink assembly, such as, for example, Rifa capacitors available from U.P.E. of Sweden.

With continued reference to FIGS. 1–3, the tubing string 14 includes an inlet port connector 50 and an output port 52. The tubing string 14 is preferably formed of copper and is worked into the configuration best illustrated in FIG. 2 during the manufacture of the heat sink assembly 10 as described in greater detail below. On one hand, the tubing string may be formed of a single, uninterrupted section of copper tubing. On the other hand, string 14 may be formed of a plurality of conduit construct components (e.g. joints, elbows, straight tubing sections, "T" sections, manifolds, etc.) which are brazed or welded together.

The inlet port connector 50 of the heat sink assembly 10 is adapted to receive a coolant fluid such as a compressed refrigerant as discussed in connection with FIG. 6 below, cooled oil as discussed in connection with FIG. 7 below, and chilled water as will be discussed in connection with FIG. 8 below. After the cooling fluid enters the inlet port connector 50, it travels along a first section 54 on the tubing string defined in the substantially planar base portion 20 of the main body 12. The tubing string next forms a first bend 56 in the base portion 20 followed by a second straight section 58 also formed in the planar base portion 20. Thus, according to the preferred embodiment illustrated, the first and second sections 54, 58 and the first bend 56 are disposed in the base portion 20 of the main body 12. In that manner, the set of high voltage capacitors 46 are cooled through the base portion 20.

The tubing string 14 exits the base portion 20 and bends upward forming a first upward bend 60 as illustrated. Following the first upward bend 60, the tubing string enters the left vertical side wall 22 as shown. From there, a first U-shaped section is formed by the tubing string along the left vertical side wall, the vertical end wall 26, and the right vertical side wall. The first U-shaped section 62 next forms a second upward bend 64 which connects the first U-shaped section 62 with a second U-shaped section 66. The first and second U-shaped sections 62, 66 are disposed in the heat sink assembly in a stacked vertically spaced-apart relationship as illustrated in the Figs. The first and second U-shaped sections define spaced-apart planes which are substantially parallel with the planar base portion 20 to provide an even heat absorption distribution.

The path of the second U-shaped section 66 extends first along the right vertical side wall 24, then along the vertical end wall 26, followed by a section defined in the left vertical side wall 22. The second U-shaped section within the left vertical side wall 22 next forms a third upward bend 68 as illustrated. The third upward bend 68 is oriented substantially vertically with respect to the base portion 20 and levels off horizontally within the left vertical side wall 22 at a third plane defined by a third U-shaped section 70. The third U-shaped section 70 extends along the left vertical side wall 22 toward the vertical end wall 26 and then along the right vertical side wall as illustrated. The third U-shaped section 70 exits the heat sink assembly 10 at the output port connector 52.

During the manufacture of the heat sink assembly 10 as described in greater detail below, the tubing string 14 is supported by a set of support lattices or support members 72–78 as illustrated. Each of members 72 through 78 is essentially identical and therefore only member 78 is described here in detail. Member 78 is constructed of interlocking metallic members preferably formed of copper and suitably coated with a graphite or other suitable bonding material in a manner to be subsequently described. The metallic members are formed such that adjacent tubing sections are separated thereby. The metallic members can be configured to provide any desired spacing between adjacent tube sections. In the preferred embodiment illustrated in FIG. 3 adjacent tube sections are equispaced within each lateral wall.

Figure 12:
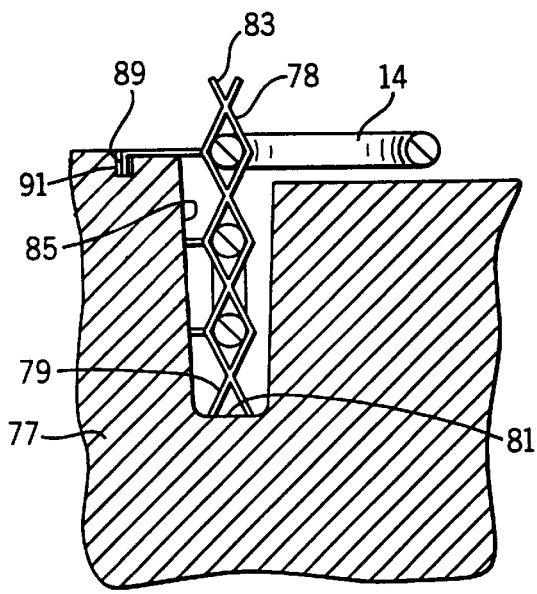
FIG. 12 is a partial cross sectional view of a tube/lattice support assembly within a mold drag.

Referring still to FIG. 3, in addition to maintaining the position of adjacent tube sections with respect to each other, support member 78 also maintains both the vertical and horizontal (i.e. lateral) positions of tube 14 within body portion 12. Referring also to FIG. 12, support member 78 and associated tubing 14 are illustrated inside a drag 77 of a sink mold. To maintain vertical position of tube 14 within body portion 12, when member 78 is positioned within drag 77, lower distal ends 79 of member 78 extend downward and contact an adjacent internal surface 81 of drag 77. Similarly, upper distal ends 83 of member 78 extend upward and contact an adjacent surface of a mold cope (i.e. the upper mold half) (not illustrated).

To maintain horizontal position of tube 14 within body portion 12, member 74 also includes lateral extensions 71, 73 and 87. Each of extensions 71 and 73 is sized such that, as illustrated in FIG. 12, when support member 78 is positioned within drag 77, distal ends thereof contact an adjacent internal drag surface 85, thereby limiting lateral tube movement. In addition, member 87 extends laterally along a break line between drag 77 and an associated cope (not illustrated), past surface 85 and includes a distal finger member or hook 89. A recess 91 is provided in drag 77 for receiving lateral extension or finger member 89. With finger member 89 received within recess 91, when the cope is secured to drag 77 prior to and during a mold forming procedure as described in detail below, member 87 further limits lateral support member 78 movement and hence maintains lateral tube position.

The support members 72–78 hold the tubing string sections in place, in the vertically spaced-apart relationship as illustrated in a mold while the molten material is poured during the casting process. Thus, in the preferred embodiment illustrated, the support members 72–78 become frozen in the vertical side walls 22, 24 during the heat sink fabrication process.

Also, in accordance with the present invention, the support members are adapted to hold various stud members or other mechanical connection devices in place during the molding process. Additional support members can be provided at various selected locations to hold the stud or attachment members in place. In that way, the studs and connection devices become frozen in the casting at predetermined positions and orientations for convenient attachment of drive hardware, electronic devices, or the like thereto.

Figure 4:
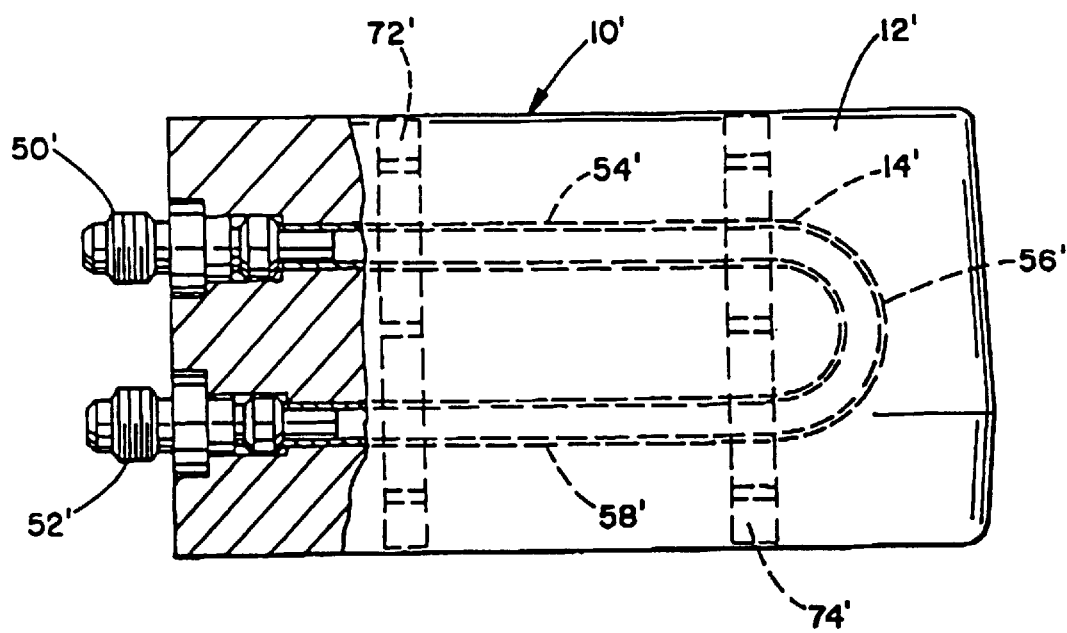
FIG. 4 is a perspective view of an alternate configuration of the heat sink of the present invention.

With reference next to FIG. 4, an alternate configuration of the heat sink of the present invention is illustrated. As shown there, a heat sink assembly 10' includes a main body portion 12', preferably formed of copper or aluminum, and a tubing string 14' preferably formed of copper or aluminum. The tubing string 14' enters the main body portion 12' at a inlet port connector 50' and extends into the main body portion 12' along a first section 54'. A first bend 56' returns the tubing string direction back towards the output port 52' along a second section 58' formed by the tubing string 14 within the main body portion 12. The second section 58' exits the main body portion 12' at an output port 52'. Similar to the embodiment described above in connection with FIGS. 1–3, the alternate configuration illustrated in FIG. 4 includes a set of support members 72', 74'. The support members function the same as described above. FIG. 4 illustrates that the present invention is not limited to the particular embodiment illustrated in FIG. 1 but is adaptable for use in connection with any heat generating devices or apparatus. As shown in FIG. 4, the present invention can be used to provide a substantially planar, regularly shaped heat sink apparatus for use in any heat transfer application. The difference in shape and arrangement illustrated between FIGS. 1 and 4 demonstrates that the present invention is adapted to provide a combined heat sink and housing system for virtually any application.

Figure 17:
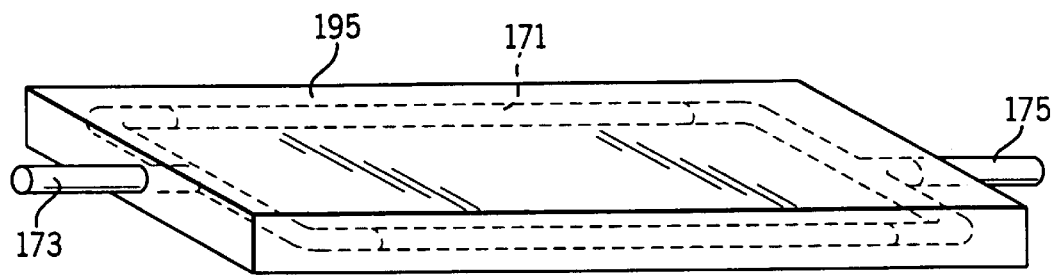
FIG. 17 is a perspective view of a sink assembly according to yet another aspect of the invention.
Figure 23:
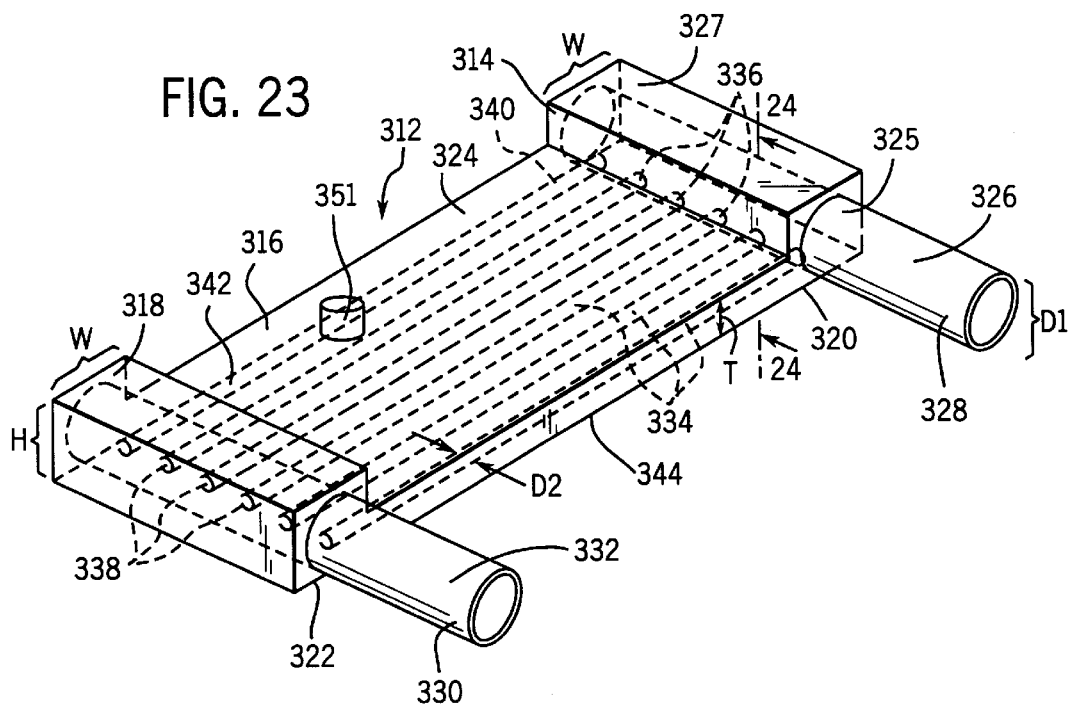
FIG. 23 is a perspective view of another embodiment of the present invention.

Referring now to FIG. 17, yet a third embodiment of the invention is illustrated. In this embodiment, instead of providing a serpentine tube path, throughout a sink body portion, a spreading type tube path having more than a single route through the body portion is provided. To this end, referring also to FIG. 18, a tube assembly 171 for guiding coolant includes a first conduit or inlet port 173 at a first end, a second conduit or outlet port 175 at a second end opposite the first end and a spreader 177 which is linked between the first and second conduits 173 and 175, respectively, and forms two passageways therebetween. Spreader 177 includes a first manifold 179 which is linked to first conduit 173 and splits into two different paths, a second manifold 181 which is linked to second conduit 175 and also splits into first and second paths and first and second ducts 191 and 193 which traverse the distances between the first paths and the second paths, respectively. A similar sink design including two manifolds is illustrated in FIG. 23 and is described in more detail below.

The conduits, manifolds and ducts are secured together via brazing, typically using a copper-zinc or copper-silver compound as well known in the plumbing art. A barrier material (e.g. nickle electroplating) is provided on the external surface of the conduit construct. Next, the body portion 195 (see FIG. 17) is formed around assembly 171 such that the ends of conduits 173 and 175 extend from opposite sides of body 195 and so that all brazed joints are encased within body 195.

Figure 18:
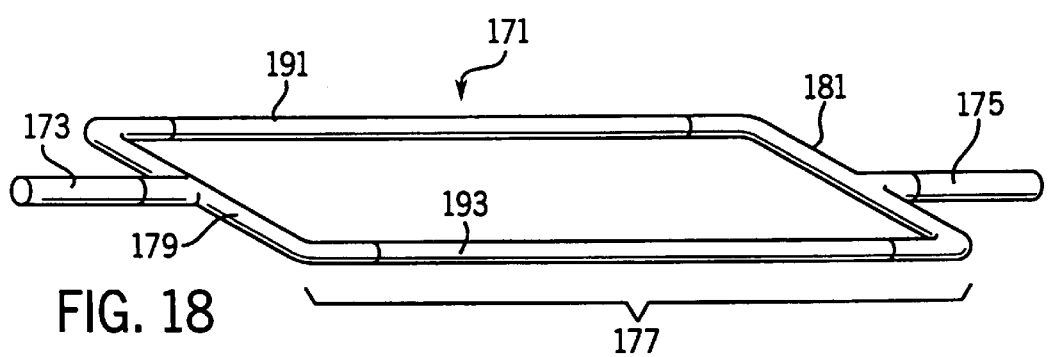
FIG. 18 is a perspective view of the tube assembly of FIG. 17.

While brazed joints typically cannot withstand extreme pressures and therefore have been avoided in the sink art, two features illustrated in FIGS. 17 and 18 facilitate use of brazing with the present invention. First, because spreader 177 increases the cross sectional area of assembly 171, pressure within that area of assembly 171 is substantially reduced. Second, by encasing all brazed joints within body 195, body 195 provides support to each brazed joint thereby strengthening the joint.

In addition to helping to facilitate the use of brazed joints, the spreader 177 also enables a relatively smaller pump to be used to provide coolant to assembly 171 due to the reduced pressure therein.

Brazing enables pre-fabricated conduit construct components (e.g. elbows, joints, "T" members, straight tubing sections, etc.) To be linked together in essentially any conceivable form to configure one serpentine cooling path or a manifolded multi-path design for cooling liquid. Using pre-fabricated conduit components tight radii are easily achievable or, in the cae of some configurations including a manifold, are completely eliminated. Assuming a thick enough barrier material layer, using a barrier material which blocks outgassing enables use of copper conduit and conventional brazing compounds without substantial risk of explosion.

Figure 21:
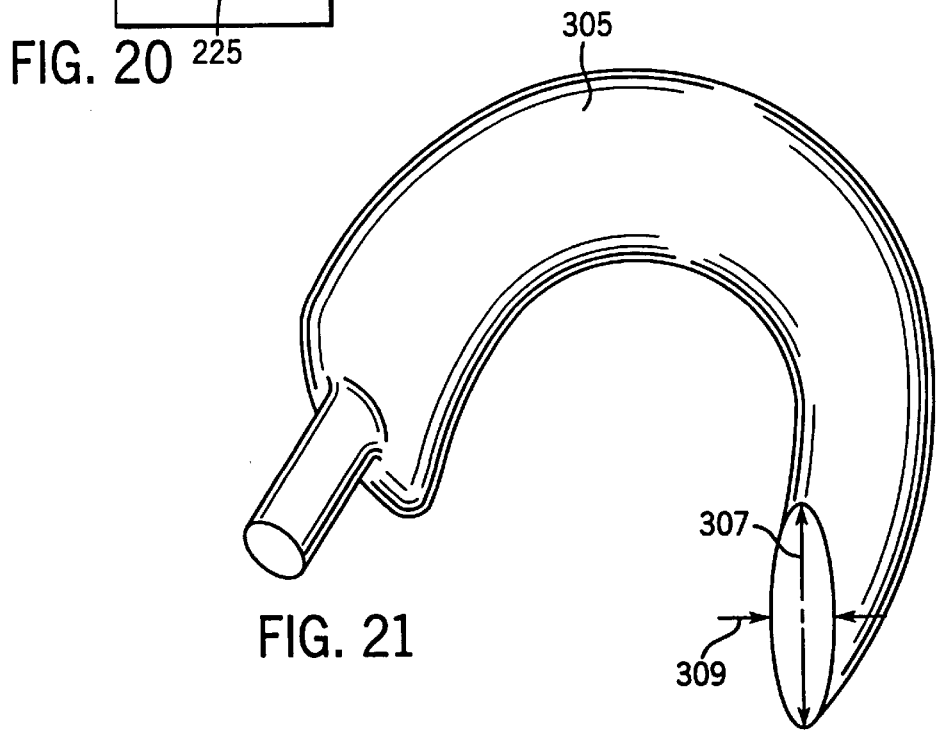
FIG. 21 is a perspective of a conduit construct according to one aspect of the present invention.

It should be appreciated that, while a very simple spreader is illustrated in FIGS. 17 and 18, any type of spreader could be used with the present invention. For example, a spreader to accommodate many more ducts (e.g. 10) could be provided or, in the alternative, several spreaders could be formed within a body 195. Moreover, referring to FIG. 21, other tubing configurations such as a flattened tube 305 having first 307 and second 309 perpendicular cross-sectional dimensions wherein the first dimension 307 is larger than the second dimension 309, could be used with the present invention.

Figure 5:
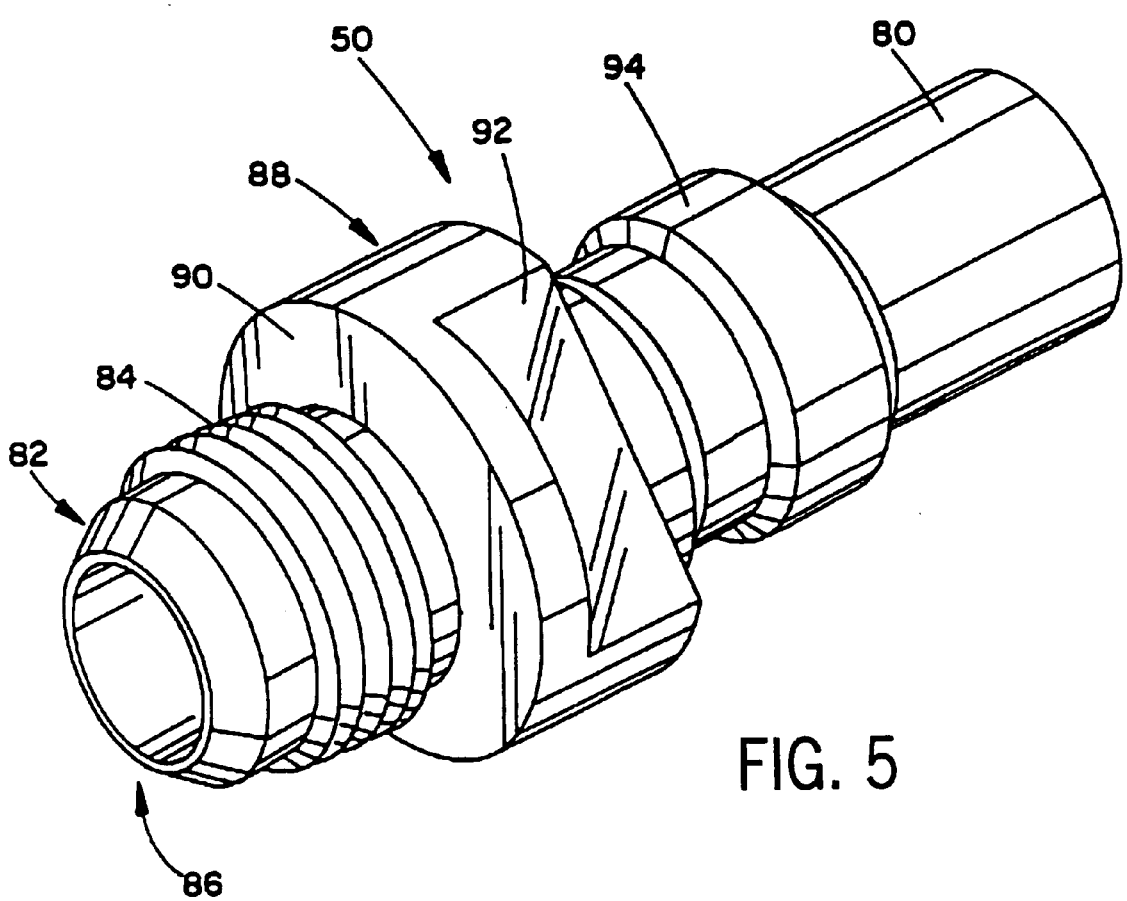
FIG. 5 is an isometric view of an end fitting cast into the cold plate of the present invention for convenient connection to the internal tubing string.

FIG. 5, is a detailed illustration of the preferred inlet port connector 50 provided on one end of the tubing string 14 in accordance with the present invention. The outlet port connector 52 is formed substantially identically to the inlet port connector 50 illustrated in FIG. 5 and, accordingly, the description below is equally applicable to the outlet port as well.

Turning now to FIG. 5, the inlet port connector 50 includes a first end 80 having a smooth bore adapted to connect with the tubing string 14 using any suitable technique but, preferably, by brazing with navel brass. The second end 82 of the inlet port connector includes a threaded region 84 and an outer tapered region 86 adapted for direct mechanical connection to a corresponding mating connector provided by a target application system to which the heat sink assembly 10 is to be applied. In its preferred use, the inlet port connector 50 extends only partially into the main body portion 12 of the heat sink assembly 10. In that regard, an enlarged shoulder region 88 includes a flat front face 90 which defines a plane dividing the inlet port connector into a section to the left of the plane and a portion to the right of the plane as viewed in the Fig. The portion to the right of the plane extends into the main body portion of the heat sink. In that way, the threaded region 84 as well as the tapered region 86 is accessible for ready connection to the target application. The portion of the inlet port connector to the right of the plane defined by the front face 90 as viewed in the Fig. includes a flat surface 92 formed in the shoulder region 88 and a ring area 94 positioned on the inlet port connector between the shoulder region and the first end 80. Functionally, the flat surface 92 prevents rotational movement about the longitudinal axis of the inlet port connector such as may occur when a nut or other fastener is connected to the threaded region 84. In a similar fashion, the ring area 94 prevents movement of the tubing string and inlet port connector along the longitudinal axis thereof during connection or other manipulation of the inlet port connector.

Figure 6:
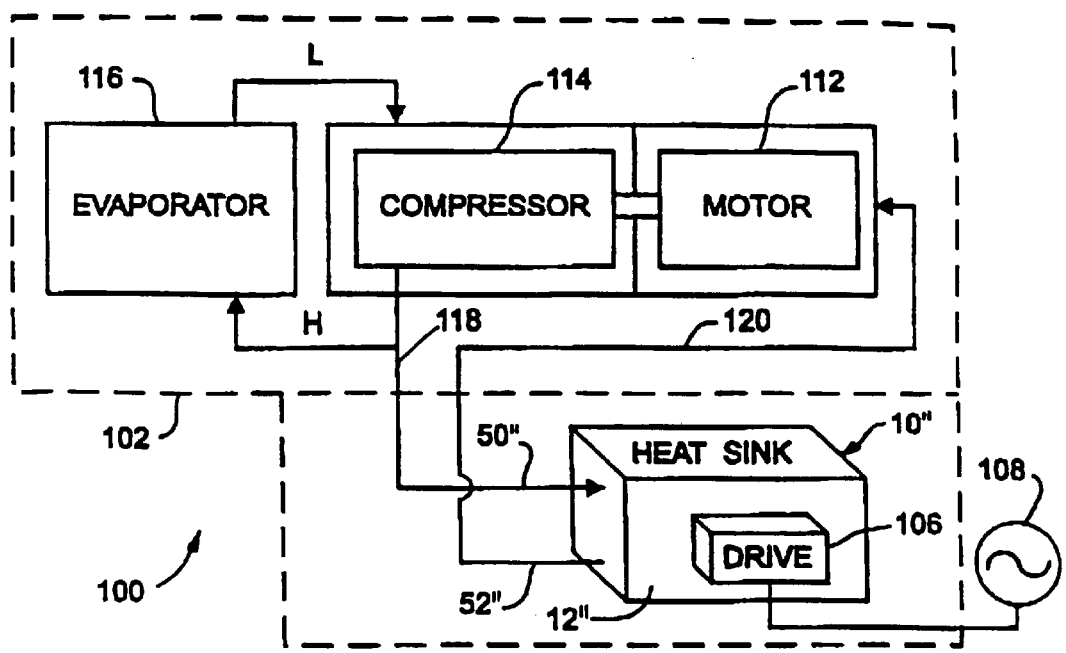
FIG. 6 is a schematic diagram of the heat sink apparatus of the present invention used in conjunction with a hermetic motor in an air conditioning application.

Turning next to FIG. 6, a schematic diagram of the heat sink described above used in conjunction with a hermetic motor and compressor apparatus in a refrigeration system 100 is illustrated. In general, the refrigeration system 100 is comprised of a refrigeration or automotive application portion 102 and a power section 104. The power section includes a motor drive 106 and a heat sink assembly 10" of the type described above.

The heat sink assembly 10" includes a main body portion 12" and a tubing string 14" disposed therein. The tubing string 14" enters the main body portion 12" at an inlet port connector 50" and exits the main body portion of the heat sink assembly at an output port 52". The power semiconductor devices comprising the motor drive 106 are disposed on the main body portion 12" of the heat sink assembly 10" in a manner described above. The motor drive 106 receives power from an external source 108 and generates appropriate motor command signals on motor lead wires 110.

The refrigeration application portion of the embodiment illustrated in FIG. 6 includes a hermetic motor 112 directly coupled to a refrigeration compressor 114. Hermetic motors are specially designed for use with refrigerants. More particularly, the rotors and stators forming a hermetic motor are particularly adapted to receive a compressed refrigeration fluid directly into the motor itself. As the compressed refrigeration fluid expands, it absorbs heat from the motor thus cooling the motor during operation. Hermetic motors are typically connected directly to the refrigeration compressors to enable the refrigerant to flow through the motor and into the pick-up tube in the compressor.

As illustrated in FIG. 6, the refrigeration compressor 114 is connected to both a standard evaporator 116 and to the inlet port connector 50" of the heat sink assembly 10". Thus, during operation of the refrigeration system 100, compressed refrigerant is delivered to both the evaporator 116 and the heat sink assembly 10" to cool the power components of the motor drive 106 mounted thereon. A first fluid conduit 118 connects the heat sink assembly 10" to an output port on the high pressure side of the compressor 114. A second fluid conduit 120 is connected to the output port 52" of the heat sink assembly 10' to enable a return path of the refrigerant to the compressor through the hermetic motor 112.

Figure 7:
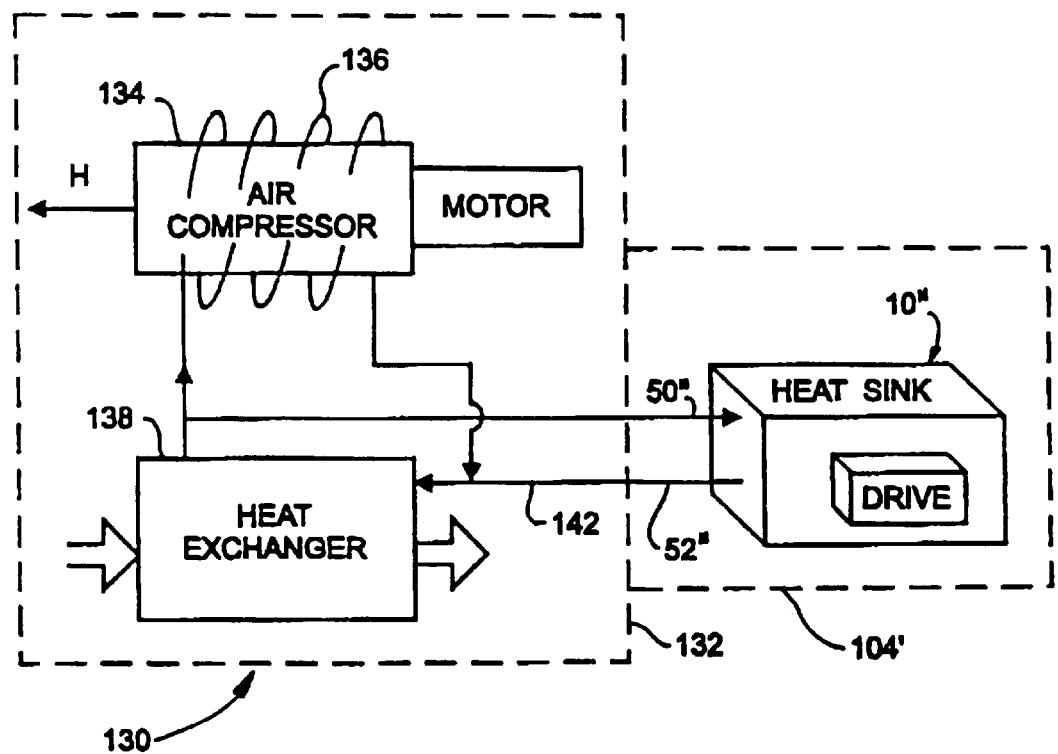
FIG. 7 is a schematic diagram of the heat sink apparatus of the present invention used in conjunction with an oil-cooled air compressor application.

FIG. 7 illustrates a air compressor system 130 including an air compressor application portion 132 and a power section 104". In this embodiment, the heat sink assembly 10" is adapted to use oil as a cooling medium. The cooling oil is sourced from the air compressor application portion 132. As shown, the cooling oil is used in the air compressor application portion to cool an air compressor 134 by circulating an oil coolant between a spiral conduit 136 surrounding the air compressor and a heat exchanger 138. In this embodiment, the inlet port connector 50" of the heat sink assembly 10" is connected to a source of cool oil from the heat exchanger 138. The output port 52 is connected through a second fluid conduit 142 for returning the oil flowing through the heat sink assembly back to the heat exchanger 138.

Figure 8:
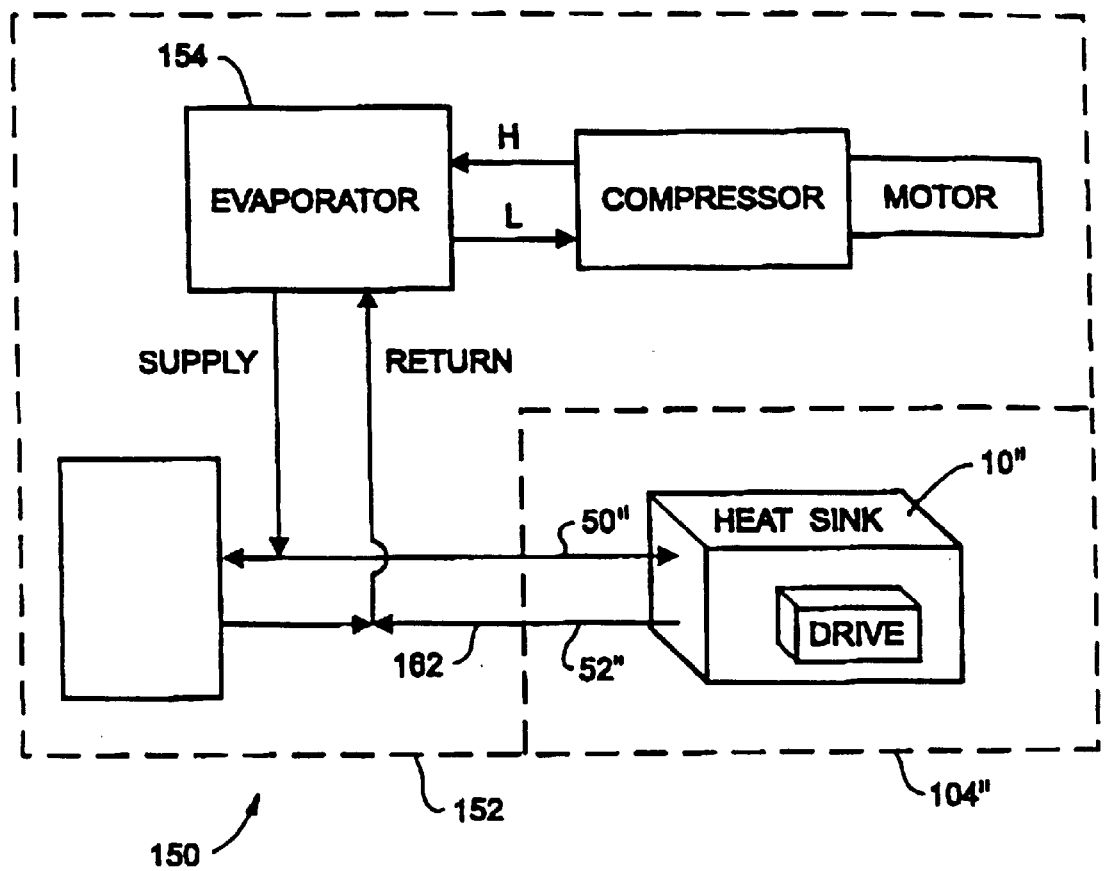
FIG. 8 is a schematic diagram of the heat sink apparatus of the present invention used in conjunction with a chilled-water air conditioning or automotive application.

FIG. 8 illustrates a chilled water system embodiment of the present invention wherein the chilled water application portion 152 includes a refrigerantwater heat exchange evaporator 154 connected to a residential or commercial chilled water air conditioning system 154. In the embodiment illustrated in FIG. 8, the heat sink assembly 10" is adapted to receive a supply of chilled water at the inlet port connector 50" and to recirculate the chilled water back to the chilled water application portion 152" through a second fluid conduit 162 connected to the outlet port 52".

Figure 9:
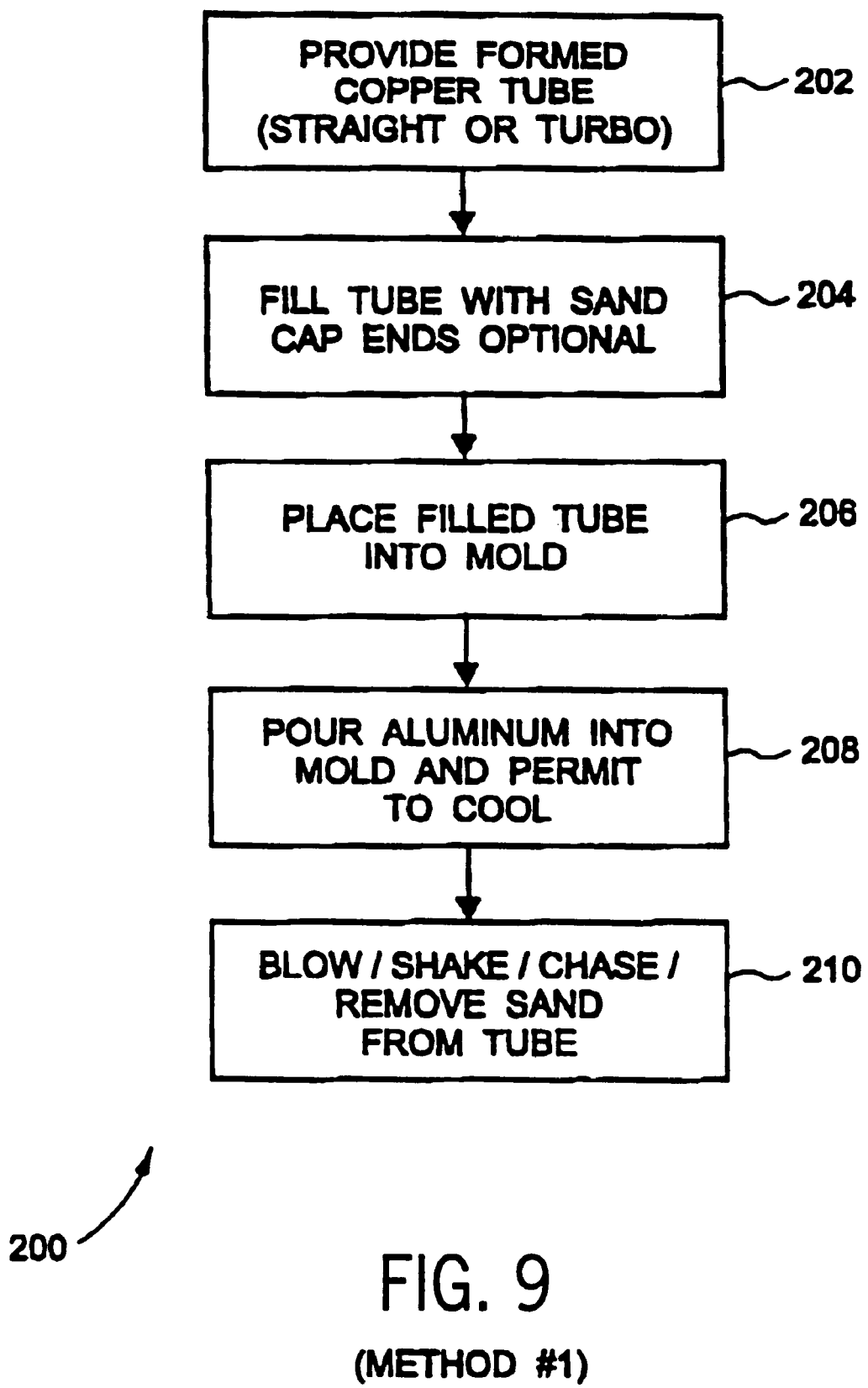
FIG. 9 is a flow chart describing a first preferred method of making the heat sink apparatus of the present invention.

With reference next to FIG. 9, a first preferred method 200 for making the heat sink assembly of the present assembly will be described. First, in step 202, an elongate tube is provided and bent into a desired configuration. In the alternative, the desired construct form may be achieved via brazing components as described above. Preferably, the tube is metallic and formed of either copper or aluminum. The tubing may be smooth "straight wall" tubing, "gun barrel" type tubing, knurled or "turbo" tubing available from TurboTec. The outer surface of the tubing is cleaned to remove oxides and other contaminates by sandblasting, chemical itching, or vapor degreasing the tubing.

Next, the formed tubing string or conduit construct is filled with sand and the ends are capped in step 204. The sand filled tubing string is then placed in a mold at step 206 into which a molten metallic material is poured in step 208. A barrier material selected to prohibit alloying and/or outgassing may be provided on the outer surface of the conduit construct prior to placement in the mold. The molten metallic material may be either aluminum or copper, but preferably is aluminum. The molten material is permitted to cool.

After the molten material cools and solidifies, the sand is removed from the tubing string in step 210 by blowing, shaking, chasing or with compressed air.

The first preferred method 200 advantageously treats the inner surface of the tubing string by the interaction of the sand with the inner surface of the tube. As the molten material cools and shrinks around the tubing string, the tube compresses on the sand therein which causes some slight scratching or denting of the inner surface of the tube. This "roughed up" effect assists in the thermal transfer characteristics of the heat sink assembly by increasing flow turbidity and cross-sectional inner surface area within the tubing string.

Figure 10:
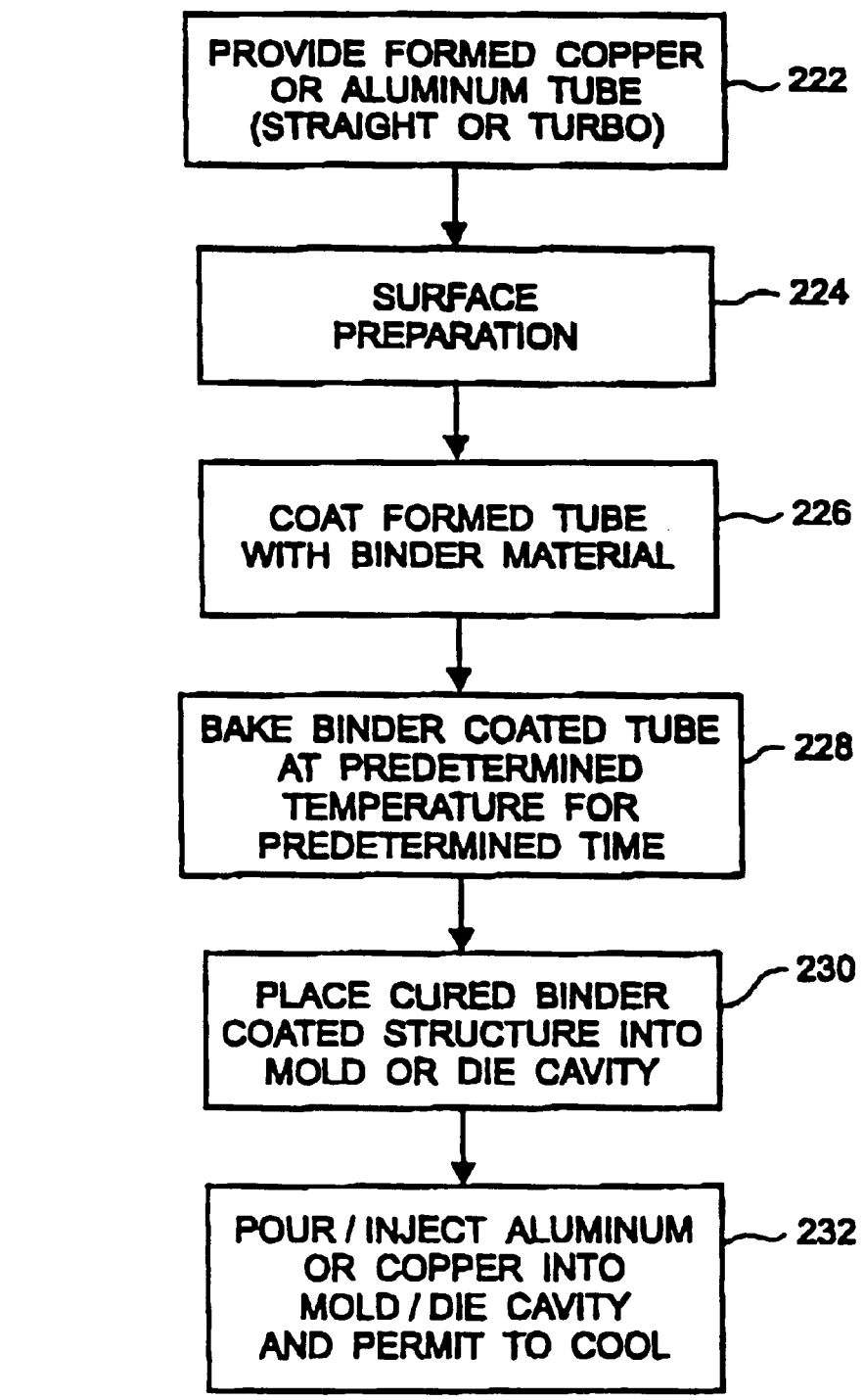
FIG. 10 is a second preferred method for forming the heat sink apparatus according to the present invention.

With reference next to FIG. 10, a second preferred method 220 of forming the heat sink assembly according to the present invention will be described. First, in step 222, a metallic tube of either copper or aluminum, but preferably copper, is worked into a predefined shape or conduit construct components are brazed together in the predefined shape. The tubing may be smooth "straight wall" tubing, "gun barrel" type tubing, knurled or "turbo" tubing available from TurboTec. Referring also to FIGS. 2 and 3, in addition to forming the predefined shape, at step 222, support lattices 72, 74, 76 and 78 are formed around the shape either during shaping or thereafter to maintain the tubing in the desired shape and in a specific location with respect to body section surfaces. Also, to this end, refer Next, in step 224, the surface of shaped tubing string is prepared to receive a binder material coating. Preferably, the surface preparation includes sandblasting the outer surface of the tubing string and support members to clean those surfaces removing oil, dirt, and other contaminants therefrom including any oxide layers that may have formed there. Alternatively, the surface preparation step 224 may include cleaning the outer surface of the tubing string by chemical etching processes or by vapor degreasing methods. For vapor degreasing, perchlorethylene PCE has proven to be very effective.

After the surface of the tubing string is prepared, the shaped tubing string is coated with a binder material at step 226. The binder material must have specific characteristics. To this end, each of the materials used to form the tube 14 and main body portion 12 is formed of a metallic material. The tube material is characterized by a first melting point while the body material is characterized by a second melting point. In addition, any pair of materials used to form the tube and body will be characterized by an alloying temperature at which the pair of materials tend to alloy together. Typically the alloying temperature is lower than either of the material melting temperatures. The binder material must be capable of forming a barrier to alloying between the first and second materials at temperatures up to and including a pouring temperature of the material used to form the body portion 12.

To this end it has been found that certain graphite compounds operate as advantageous binder materials. For example, one preferred binder material is formed of 40% water and 60% emulsion, the emulsion preferably comprising 60% graphite solids content and 40% silicon solids content. One commercially available binder material that provides adequate coating is Refcobar 2205 which is mixed with water, two parts Refcobar 2205 to one part water, so that the binder material can be sprayed through a spray gun.

In addition to prohibiting alloying, the binder material should also be selected such that the binder material operates as a skin barrier to block outgassing during conduit construct re-crystallization. To this end, preferably, the binder material is nickel based (e.g. a nickel-electroplating or nickel-manganese compound 2–15% manganese).

Next, in step 228, the binder material coated formed tubing string is baked at a predetermined temperature for a predetermined time in order to cure the binder material onto the tubing string. This step is not necessary where the binder material has been electroplated onto the construct. In the preferred embodiment, the bake temperature is above 210° F., but preferably not above 250° F. Preferably, the binder material coated tubing string is baked until any water in the binder material is boiled off.

Once the binder material is cured onto the formed tubing string, the structure is placed into a mold or die cavity in step 230. In step 232, a molten metallic material such as aluminum or copper, but preferably aluminum, is poured or injected into the mold or die cavity and permitted to cool. Once cooled, the completed heat sink assembly can be removed from the mold or die cavity and used in a manner described above.

In addition to the inventive apparatus and method described above, the present invention also covers the general concept of forming a cold plate or heat sink which includes walls formed in at least two different planes so that the volume required to configure an assembly including the sink and electronic components mounted thereon is minimized. Generally, it has been recognized that different electronic components have different shapes, sizes and dimensions and that, by providing sink walls for mounting devices in several different planes such that similarly sized device dimensions are aligned, the total volume required to configure a sink and associated devices can be minimized. For example, where first and second different devices each have a long dimension and each have a relatively shorter dimension, by providing a sink which allows the devices to be positioned such that their long dimensions are aligned, volume can be minimized. This general concept of aligning similar device dimensions is referred to hereinafter as dimension alignment.

In the alternative, it has been recognized that, in some cases, volume can be minimized by, where devices to be mounted to a heat sink have different dimensions and at least one device dimension is relatively large compared to other device dimensions, stacking devices having small dimensions adjacent the device which has the large dimension. This general concept of stacking devices is referred to hereinafter as stacking alignment.

Moreover, it has also been recognized that, in some cases, heat sink/device volume can be minimized by placing heat generating devices on opposite sides of a heat sink wall. In particular, where a first subset of heat generating devices includes a large dimension perpendicular to a heat dissipating surface and a second subset of heat generating devices include large dimensions along the heat dissipating surfaces, the first subset can be placed on a first wall surface and the second subset can be placed on a second wall surface opposite the first wall surface. This general concept of placing devices on opposite sides of a heat sink wall is referred to hereinafter as dual surface alignment. Each of the general inventive concepts of dimension alignment, stacking alignment and dual surface alignment are described in more detail below.

Dimension Alignment

Figure 11:
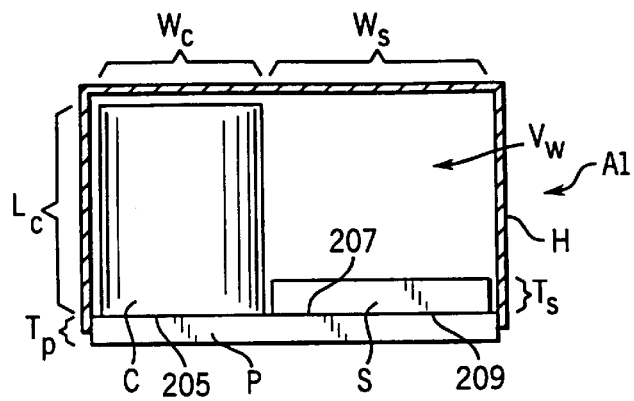
FIG. 11 is a schematic of a prior art sink assembly.
Figure 13:
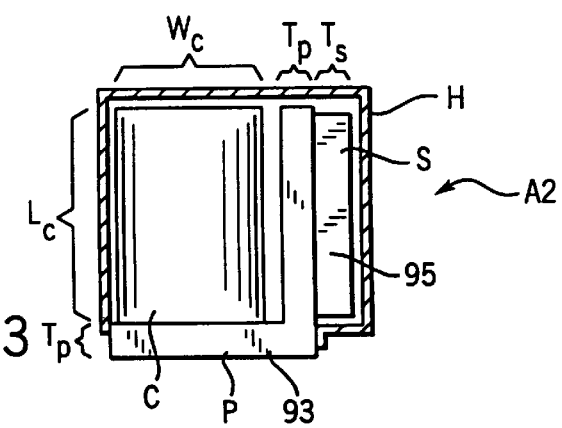
FIG. 13 is a schematic of a sink assembly according to one embodiment of the present invention.

FIG. 13 is similar to FIG. 11 in that the assembly illustrated includes a single capacitor C and a single switching device S having the same dimensions as the components in FIG. 11. However, instead of being mounted to a planar cold plate, capacitor C and device S are mounted to an inventive heat sink P including a first wall 93 and a second wall 95 which is perpendicular to first wall 93. Capacitor C is mounted to wall 93 and device S is mounted to wall 95 on a side opposite capacitor C. The total volume V2 required for assembly A2 is:

$$V2=(Lc+Tp)(Wc+Ts+Tp)(Da) \qquad (2)$$

where Da is assembly depth into FIG. 13 (e.g. where assembly A2 is one device deep, Da may be either device S length Ls or capacitor C width Wc). Subtracting Equation 2 from Equation 1 yields:

$$V1-V2=(Lc+Tp)(Ws-Ts-Tp)(Da) \qquad (3)$$

Comparing FIGS. 11 and 13 and analyzing Equation 3, clearly, where the combined thicknesses Ts and Tp are less than the width Ws of switching device S, volume V2 is smaller than volume V1. As indicated above device thickness Ts is minimal and therefore, where plate thickness Tp is also minimized, the overall volume required for assembly A2 is less than volume V1. In addition, because the volume defined by assembly A2 is relatively more rectilinear than the volume defined by assembly A1, a simple housing configuration can be used to protect assembly A2 without sacrificing volume.

Once again, while the wasted volume Vw in exemplary conventional assembly A1 which can be avoided by configuring assembly A2 appears minimal, as additional switching devices and capacitors are added to an assembly, the volume which can be saved by providing a sink including two or more mounting surfaces in different planes becomes substantial.

Referring again to FIG. 1, the sink illustrated therein includes six separate walls which are arranged in different planes. The walls include a planar base portion 20, two opposing planar side walls 22 and 24 and three planar regions or end walls 27, 28 and 29 which together traverse the distance between opposing walls 22 and 24. Walls 22, 24, 27, 28 and 29 extend upwardly from a periphery of base wall 20 forming a cavity therebetween. As described above, thirty six capacitors 46 are mounted to planar base wall 20 within the cavity, three power switching devices 36, 37 and 38 are mounted to wall 22, three power switching devices 42, 43 and 44 are mounted to wall 24 and three semiconductor power package devices 30, 31 and 32 are mounted to walls 27, 28 and 29, respectively.

Referring specifically to devices 42, 43 and 44 mounted to wall 24, dimensions plate thickness Tp, switching device thickness Ts, assembly Depth Da, switching device width Ws and capacitor length Lc which correspond the to same dimensions as indicated in FIGS. 11 and 13 are illustrated. Thus, Equation 3 holds true for wall 24. Because wall 22 and associated devices are arranged in a similar fashion as wall 24 and associated devices, Equation 3 is also separately true for wall 22. Thus, combining the volume eliminated by providing just upright walls 22 and 24, the eliminated volume is:

$$Vw1 = 2(Lc+Tp)(Ws-Ts-Tp)(Da) \qquad (4)$$

Continuing, to estimate the volume saved by proving upright walls 27, 28 and 29, first, the combined depths D1, D2 and D3 of walls 27, 28 and 29, respectively is estimated to be the distance D4 between walls 22 and 24. Second, the package thickness Tpk and package width Wpk are illustrated. Third, plugging thickness Tpk, width Wpk and depth D4 into Equation 3 for thickness Ts, width Ws and depth Da and also plugging capacitor length Lc and plate thickness Tp into Equation 3 yields a volume reduction from walls 27, 28 and 29 which can be expressed as:

$$Vw2 = (Lc+Tp)(Wpk-Tpk-Tp)(D4) \qquad (5)$$

combining Equations 4 and 5 to determine the total volume Vwt saved by providing upright walls 22, 24, 27, 28 and 29 yields:

$$Vwt = (Lc+Tp)[2Da(Ws-Ts-Tp)+D4(Wpk-Tpk-Tp)] \qquad (6)$$

Thus, it should be appreciated that by providing a sink having at least two walls in different planes, total volume required for a sink and mounted devices can be appreciably minimized.

Stacking Alignment

Figure 14:
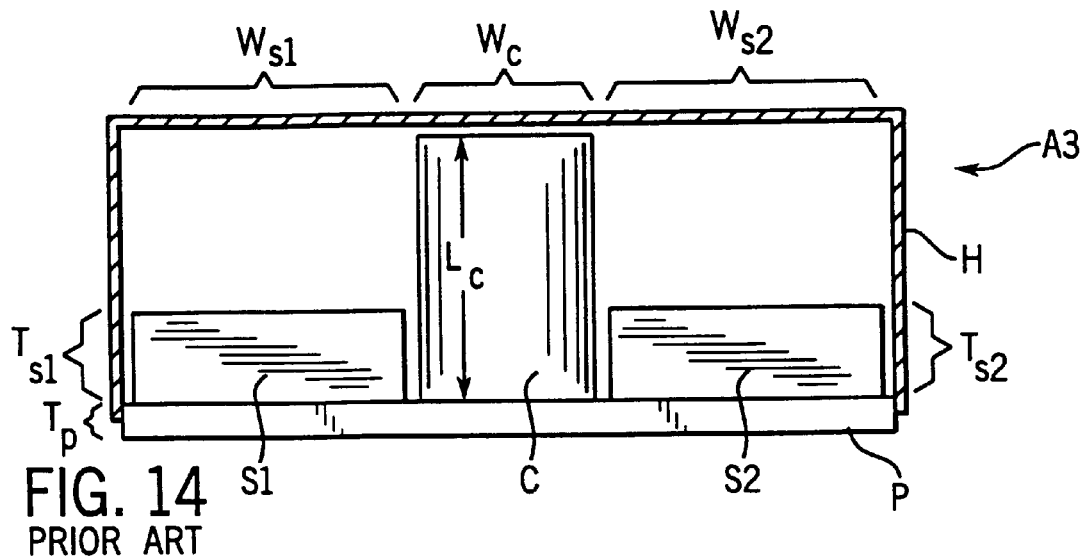
FIG. 14 is similar to FIG. 11 albeit including an additional electronic component.

FIG. 14 illustrates an assembly A3 including a single capacitor C and first and second switching devices S1 and S2 which are mounted to a planar cold plate P and are protected by a rectilinear housing H. Here, the total volume required for assembly A3 can be expressed as:

$$V3 = (Lc+Tp)(Wc+Ws1+Ws2)(Da) \qquad (7)$$

where Lc is the capacitor length, Tp is plate thickness, Wc is capacitor thickness, Ws1 is device S1 width, Ws2 is device S2 width and Da is assembly depth into FIG. 14 (e.g. where assembly A3 is one device deep, Da may be either device S1 length Ls or capacitor C width Wc). It is assumed that the thicknesses Ts1 and Ts2 of devices S1 and S2, respectively, are each approximately one third the capacitor length Lc. Clearly, with this design there is wasted volume between devices S1 and S2 and housing H.

Figure 15:
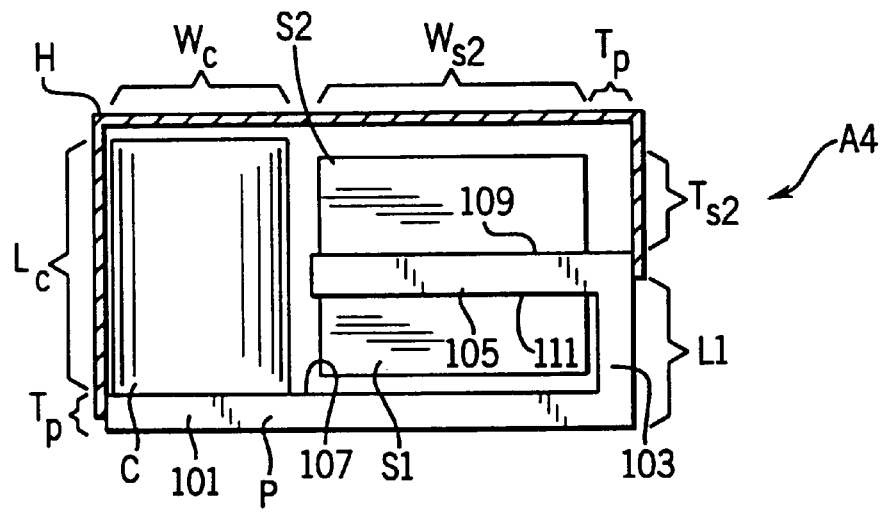
FIG. 15 is a schematic of a sink assembly according to another embodiment of the present invention.

Referring to FIG. 15, a sink assembly A4 configured in accordance with the present stacked alignment teachings is illustrated. As in FIG. 14, assembly A4 includes capacitor C and devices S1 and S2 which are dimensioned like the capacitor and devices in FIG. 14. Sink P in FIG. 15, however, instead of being single planar, includes two 90 degree bends. Thus, sink P includes a first wall 101, a second wall 103 which extends upwardly and perpendicularly from wall 101 and has a length L1 which is essentially one half capacitor length Lc and a third wall 105 which extends laterally from the distal end of wall 103 parallel to wall 101 and opposite wall 101. The length of wall 101 is limited to, approximately, capacitor width Wc plus device S1 width Ws1 plus plate thickness Tp. The length of wall 105 is limited to the width Ws1 of device S1 plus a small clearance.

Sink P in FIG. 15 provides three mounting surfaces formed by the upper surface 107 of wall 101, the upper surface 109 of wall 103 and the lower surface 111 of wall 103. Capacitor C is mounted to surface 107, device S1 is mounted to surface 111 and device S2 is mounted to surface 109. Because of the limitations on wall lengths and the configuration illustrated and described which includes stacking devices S1 and S2 adjacent capacitor length Lc, the volume of assembly A4 is appreciably less than the volume of assembly A3 (see FIG. 14). The volume of assembly A4 can be expressed as:

$$V4 = (Lc+Tp)(Wc+Ws1+Tp)(Da) \qquad (8)$$

Subtracting Equation 8 from Equation 7 yields:

$$V3-V4 = (Lc+Tp)(Ws2-Tp)(Da) \qquad (9)$$

Comparing FIGS. 14 and 15 and analyzing Equation 9, clearly, where thickness Tp is less than the width Ws2 of switching device S2, volume V4 is smaller than volume V3. Preferably plate thickness Tp is minimal and therefore the overall volume required for assembly A4 is less than volume V3. In addition, because the volume defined by assembly A4 is relatively more rectilinear than the volume defined by assembly A3, a simple housing configuration can be used to protect assembly A4 without sacrificing volume.

Once again, while the wasted volume in exemplary conventional assembly A3 which can be avoided by configuring assembly A4 appears minimal, as additional switching devices and capacitors are added to an assembly, the volume which can be saved by providing a sink which facilitates stacking devices adjacent a relatively large device dimension becomes substantial.

Figure 19:
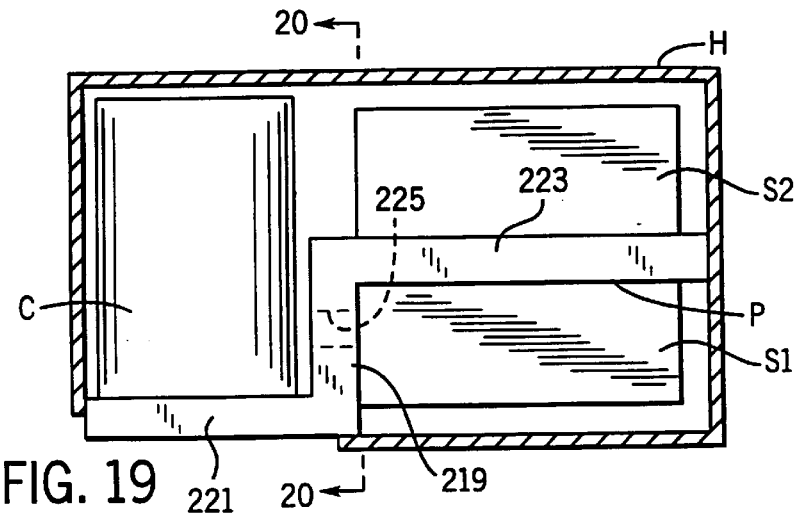
FIG. 19 is a schematic similar to FIG. 15, albeit illustrating another stacked embodiment.
Figure 20:
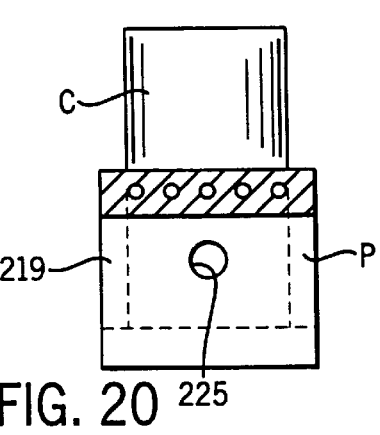
FIG. 20 is a cross-sectional view taken along line 20—20 of FIG. 19.

Another stacked assembly A5 is illustrated in FIGS. 19 and 20. Like assembly A4 of FIG. 15, assembly A5 includes a three wall plate P wherein one capacitor C and two devices S1 and S2 are mounted in a stacked configuration. In this case, however, instead of providing a vertical wall (e.g. 103 in FIG. 15) at a distal end of a first wall (e.g. 101 in FIG. 15), a vertical wall 219 is placed between two parallel mounting walls 221 and 223. As best seen in FIG. 20, an aperture 225 may be provided in wall 219 to allow electrical buses and cables access therethrough for connection of devices and capacitors. Aperture 225 will typically be machined after plate P formation.

Figure 16:
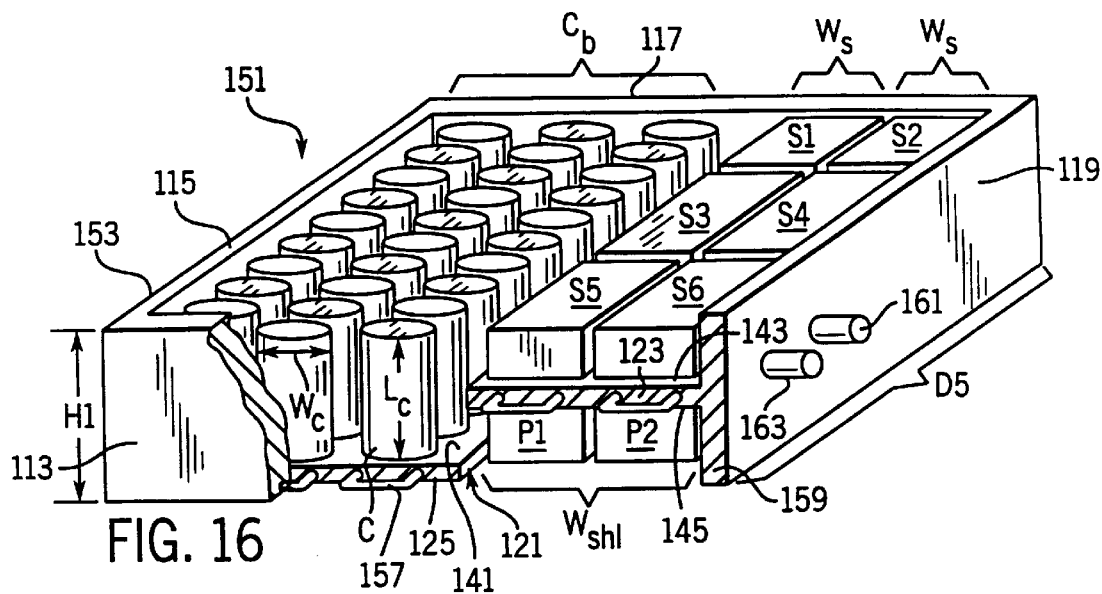
FIG. 16 is an isometric elevational view of a second embodiment of the present invention showing a stacked alignment type sink with an end portion of an external wall removed exposing the internal tubing.

Referring now to FIG. 16, a preferred assembly 151 including a sink 153 and associated mounted devices configured in accordance with the stacked alignment concept is illustrated. The assembly of FIG. 16 includes four walls 113, 115, 117 and 119 which together form a box about an area 121. Wall height Hi is approximately equal to the sum of a wall or plate thickness Tp plus the a length Lc of a capacitor C. Walls 113 and 117 are oppositely facing while walls 115 and 119 are oppositely facing. In addition, first and second shelves or internal walls 123 and 125 are positioned inside area 121. Shelf 123 extends from the mid-section of wall 119 toward wall 115 and traverses the distance between walls 113 and 117. The width Wsh1 of shelf 123 is sized so as to accommodate the widths $W_s$ of two switching devices S1 and S2 while the length of shelf 123 is sized to accommodate the combined depths of three switching devices, collectively referred to by D5.

Shelf 125 extends from a lower end of wall 115 toward wall 119 and traverses the distance between walls 113 and 117. The width Wsh1 of shelf 125 is sized so as to accommodate the widths of a capacitor bank Cb while the length of shelf 125 is sized to accommodate the depth of bank Cb which is assumed to be similar to depth D5.

In the example illustrated bank Cb includes thirty capacitors, each of which are mounted to an upper surface 141 of shelf 125. In addition, six switching devices S1, S2, S3, S4, S5 and S6 are mounted to an upper surface 143 of shelf 123 while six power devices, only two of which are shown as P1 and P2, are mounted to a bottom surface 145 of shelf 123.

As in the embodiment illustrated in FIG. 1, in FIG. 16 sink 153 is formed, preferably, of a copper tube 157 surrounded by an aluminum body 159 which forms walls 113, 115, 117, 119, 123 and 125. Tube 157 includes an inlet port 161 and an outlet port 163 for providing a coolant to sink 153. Although not illustrated in detail, tube 157 winds through at least shelves 123 and 125 between ends 161 and 163 so that all device and capacitor mounting surfaces contact surfaces which are adjacent cooling tube portions. In addition, if desired, tube 157 may also be routed through walls 113,115, 117 and 119 to provide facilitate further cooling.

In addition to providing a tubing path between shelves 123 and 125, walls 113, 115, 117 and 119 provide a protective housing for devices mounted to sink 153. To this end, with respect to walls 113, 115, 117 and 119 through which tube 157 does not have to pass, those walls can be formed relatively thinly so as to further minimize assembly 151 volume.

Referring still to FIG. 16, if devices where not stacked as illustrated, switching devices S1–S6 would have to be positioned adjacent packages P1–P6 (not P6 not illustrated). Thus, assuming relatively thin walls 113, 115, 117 and 119, the volume reduction realized by stacking devices as illustrated can be expressed as:

$$Vw=(Lc+Tp)(Ws+Ws)(D5) \qquad (10)$$

Thus, it should be appreciated that by providing a sink having at least two walls wherein one wall is positioned to stack devices adjacent a long dimension of other devices, total volume required for a sink and mounted devices can be appreciably minimized.

Dual Surface Alignment

Figure 22:
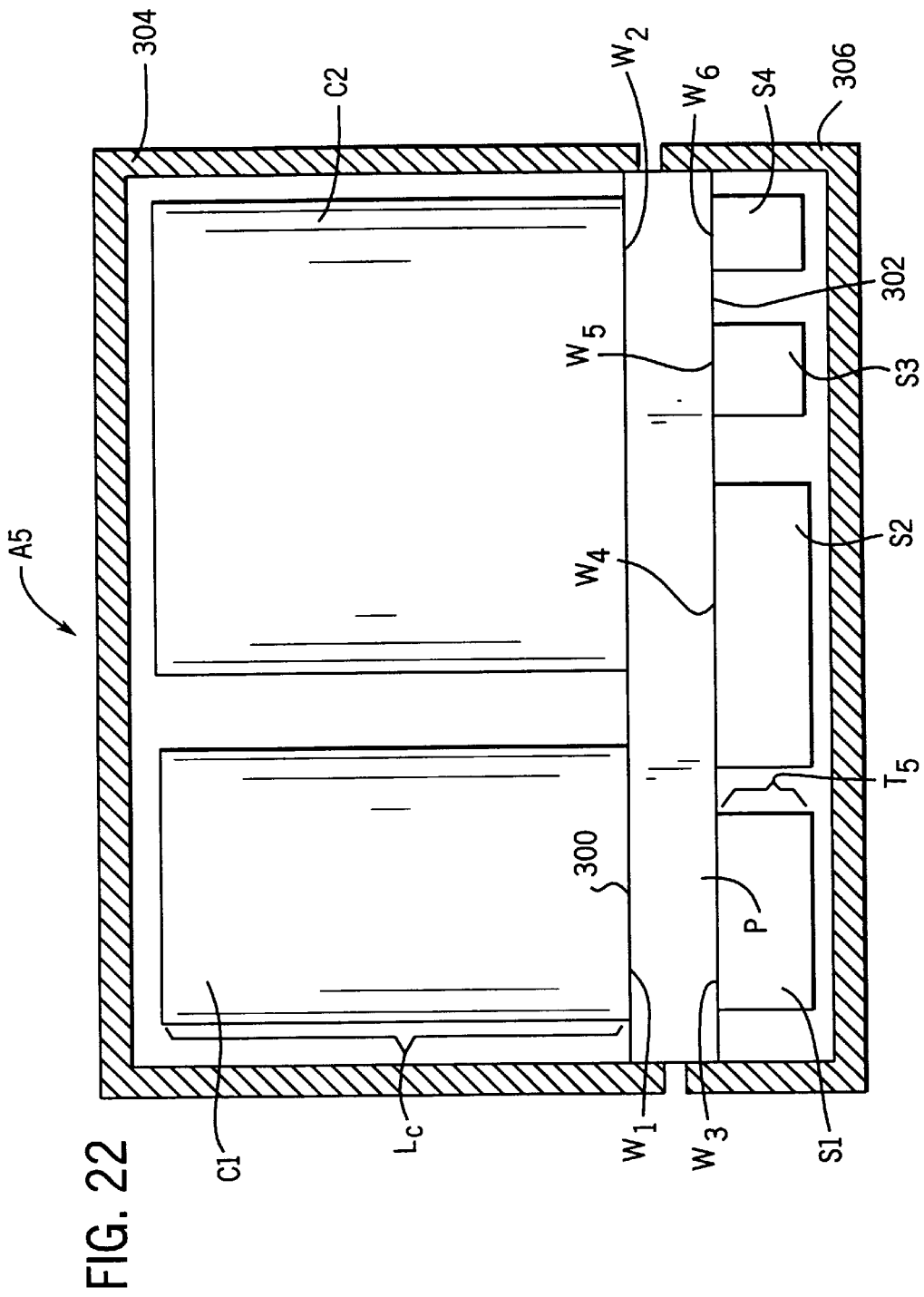
FIG. 22 is a schematic of a sink assembly according to yet another embodiment of the present invention.

Referring now to FIG. 22, a sink assembly A5 configured in accordance with the present dual surface alignment teachings as illustrated. Assembly A5 includes two differently dimensioned capacitors C1 and C2 and four separate devices S1, S2, S3 and S4. Capacitors C1 and C2 have similar long dimensions Lc which are perpendicular to heat dissipating surfaces W1 and W2, respectively. Each of devices S1, S2, S3 and S4 are characterized by a thickness dimension Ts which is perpendicular to heat dissipating surfaces W3, W4, W5 and W6, respectively, thickness dimension Ts being substantially less than length dimension Lc.

A heat sink P which is preferably a liquid cooled heat sink constructed in accordance with the teachings of the present invention, has first and second oppositely facing surfaces 300 and 302. Capacitors C1 and C2 are mounted to first surface 300 while devices S1, S2, S3 and S4 are mounted to second surface 302 to form a relatively compact configuration. First and second housings 304 and 306 are provided, housing 304 closing devices C1 and C2 which are mounted to first surface 300 and second housing 306 enclosing devices S1, S2, S3 and S4 which are mounted to second surface 302.

Although not illustrated, the invention is also meant to include a heat sink/electronic device configuration like the one illustrated in FIG. 22 wherein devices of various shapes and sizes are mounted to each of the first and second surfaces 300 and 302.

It should be appreciated that by providing heat generating devices on both sides of a heat sink wall, sink surface area is used to its fullest extent and relatively efficient heat dissipation per unit volume results. In some cases, perhaps, generated heat may be extreme due to the relatively small sink size. In these cases heat dissipation capabilities may be enhanced by increasing cooling liquid flow/second through a given conduit construct via a more powerful liquid pump. In the alternative, a sink including a manifold conduit construct (see FIGS. 18 and 23) may be provided which enables increased liquid flow and hence additional cooling.

Other Embodiments

Referring now to FIG. 23, in another embodiment of the present invention, a liquid cooled heat sink 312 is provided which includes a conduit construct generally referred to by numeral 325 encased within a metallic body member 327. Each of construct 325 and body member 327 may be formed of any of several different metallic materials but, preferably, construct 325 is formed of copper and body member 327 is formed of aluminum. Construct components are preferably brazed together. Any of the methods described above or hereinafter for forming a liquid cooled heat sink including a copper construct embedded in an aluminum body member can be used to construct the sink 312.

Figure 24:
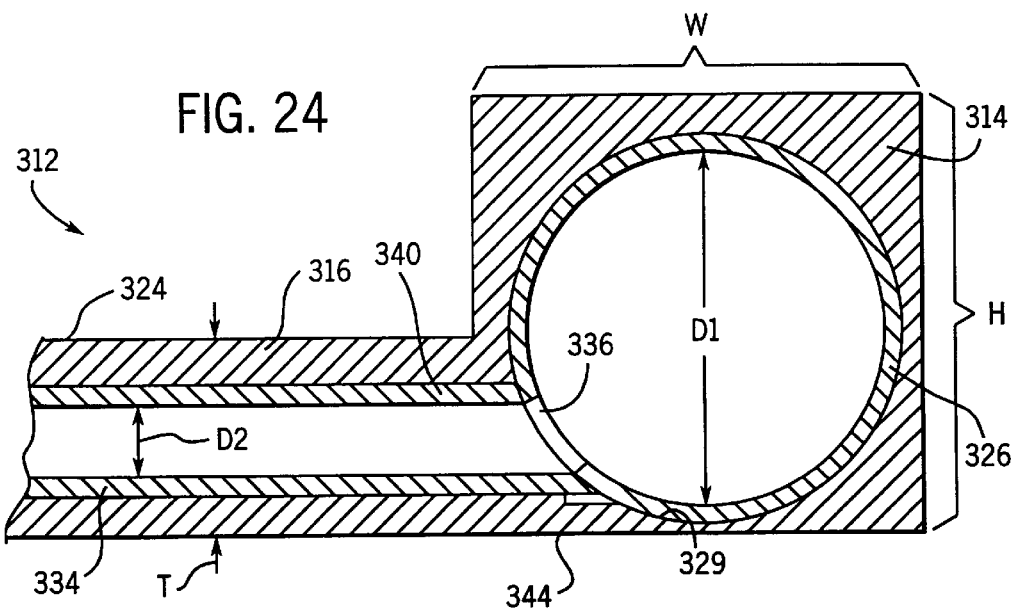
FIG. 24 is a cross-sectional view taken along the line 24—24 of FIG. 23.

Conduit construct 325 includes first and second manifolds 326 and 332 and a plurality of elongated copper tubes 334. Each of manifolds 326 and 332 have essentially the same structure and therefore only manifold 326 will be described here in detail. Referring to FIGS. 23 and 24, manifold 326 is essentially a tube-like member having a diameter dimension D1 and forming a plurality of openings collectively referred to by 336 along a lower manifold edge 329. A separate opening 336 is provided for each of tubes 334 and is sized so as to receive and be brazable to an end of one of the tubes 334. Second manifold 332 is configured in a similar manner to first manifold 326 and forms openings 338.

Each of tubes 334 is essentially a long tube-like member having a first end 340 brazed into one of openings 336 and a second 342 received and brazed into one of openings 338. Each of tubes 334 has a diameter dimension D2 which is substantially less than manifold diameter D1.

Referring still to FIGS. 23 and 24, body member 327 includes a first wall 316 which encases tubes 334. Wall 316 is generally planar and includes at least one mounting surface 324 for mounting heat generating electronic components 351 (one shown). To facilitate efficient heat dissipation, a thickness T of wall 316 is preferably minimized so that surface 324 can be as close as possible to tubes 334 (see FIG. 24).

As described above, when conduit components are brazed together, it is desirable to form body member 327 such that each brazed area is encased within body member 327. In addition, it is also advantageous to provide as much of conduit construct 325 within body member 327 as possible to protect construct 325 from damage.

Unfortunately, while wall 316 having thickness T is sufficient to encase tubes 334, wall thickness T is insufficient for encasing manifolds 326 and 332. Thus, sink 312 includes second and third walls 314, 318, respectively, at opposite ends of wall 318 extending perpendicular thereto to the side of surface 324. Walls 314 and 318 are each dimensioned so as to have a height H and a width W which encloses an associated first or second manifold 326 or 332. In the illustrated embodiment, manifold 326 is enclosed within wall 314 while manifold 332 is enclosed within 318. When so constructed, only an inlet 328 and an outlet 330, which are linked to manifolds 326 and 332, respectively, extend from body member 327 and conduit construct 325 is essentially enclosed within body member 327.

While devices may be linked to walls 314 and 318, devices need not be linked to those walls and instead, all heat generating devices 351 may be mounted to surface 324. Also, in the alternative, a subset of heat generating devices may be linked to surface 324 while a second subset of devices are linked to an oppositely facing surface 344.

Referring once again to FIGS. 13, 15 and 19, while each of the embodiments illustrated in FIGS. 13, 15 and 19 shows a heat sink which includes a body member which essentially encases a tubing string or conduit construct (not illustrated), it has been recognized that the same advantages which can be attained by using any of the embodiments of FIGS. 13, 15 and 19 can also be attained by providing a similarly shaped heat sink wherein portions of the tubing string or conduit construct are not completely encased within the body member. While advantages can be achieved with any of the general designs illustrated in FIGS. 13, 15 or 19, the exposed construct designs will be described in particular with respect to heat sinks which have the general form of the sink illustrated in FIG. 13. However, it should be appreciated that the concepts and teachings which follow are applicable to exposed construct design having different construct configurations, the different configurations including the configurations of FIGS. 15 and 19.

Figure 25:
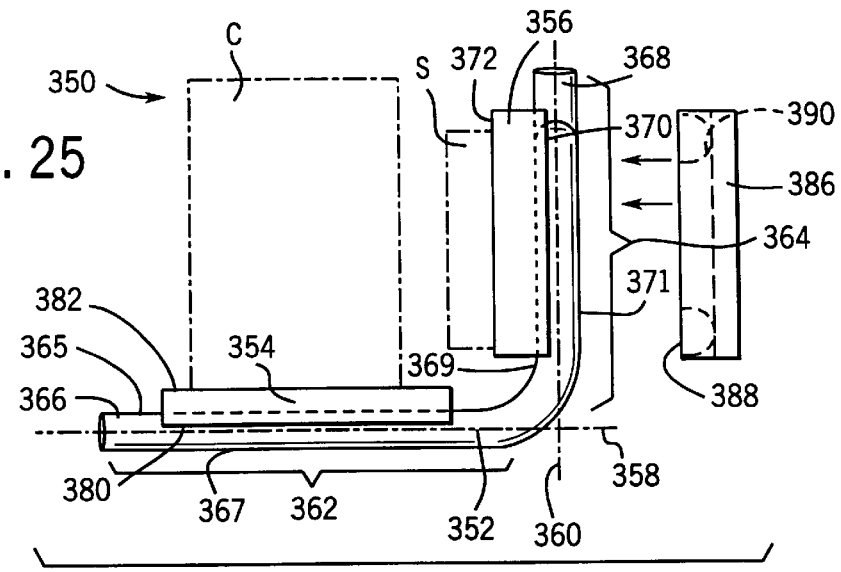
FIG. 25 is a side elevational view of a sink assembly according to another embodiment of the present invention.
Figure 26:
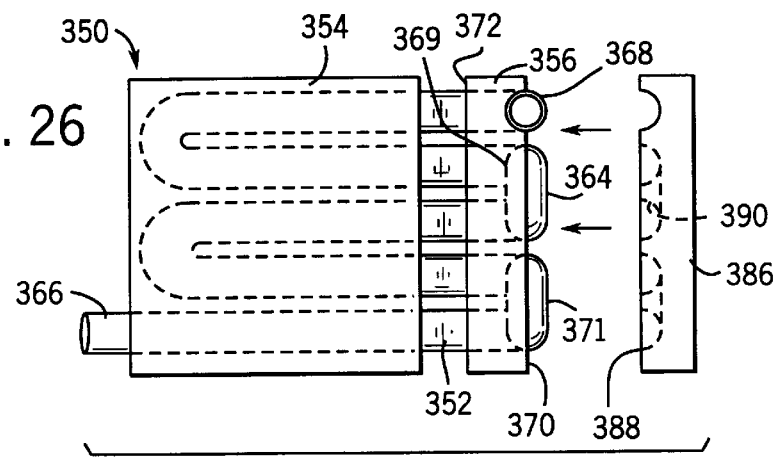
FIG. 26 is a top plan view of a sink assembly of FIG. 25.

Referring now to FIGS. 25 and 26, yet another inventive sink 350 is illustrated. Sink 350 is a liquid cooled heat dissipating sink which includes a conduit construct 352 and at least first and second body members 354 and 356, respectively. As with the embodiments described above, each of conduit construct 352 and body members 354 and 356 may be formed of any of a plurality of different types of metals, but preferably, construct 352 is formed of copper while body members 354 and 356 are formed of aluminum. However, construct 352 may be formed of aluminum, or stainless steel or some other thermally conductive material. Stainless steel is advantageous where either sea water ro ammonia are used as a cooling liquid.

Construct 352 includes a tubular member which is arranged in a serpentine pattern in first and second planes 358, 360, respectively. In the interest is simplifying this explanation, the portions of construct 352 which are in plane 358 will be referred to generally as a first construct section 362 while the portions of construct 352 in plane 360 will be referred to generally as the second construct section 364. First construct section 362 includes a fore side 365 and an oppositely facing aft side 367. Similarly, second construct section 364 includes a fore side 369 and an oppositely facing aft side 371. Construct 352 includes an inlet 366 and an outlet 368. When linked to a liquid providing pump at inlet 366, liquid travels through construct 352 adjacent body members 354 and 356 and exits outlet 368.

Referring still to FIGS. 25 and 26, body member 356 is a first fore member and includes an essentially planar plate having a heat dissipating surface 370 and an oppositely facing device mounting surface 372. Heat dissipating surface 370 is grooved such that second construct section fore side 369 is received within the grooved portion and surface 370 essentially encases fore side 396 of second construct section 364. Body member 356 can be secured to second construct section 364 in any manner known in the art including epoxy, mechanical bolting, or, indeed, physical encasement during a molding process as described above.

Body member 354 is a second fore member and also includes a heat dissipating surface 380 and a device mounting surface 382. Dissipating surface 380 is also formed with a groove (not illustrated) designed such that fore side 365 is received within the grooved section in a similar fashion to the manner in which fore side 369 is received within the grooved dissipating surface 370 of member 356. As illustrated, devices C and S may be mounted to surfaces 382 and 372, respectively.

Referring to FIGS. 13 and 25, the advantages (e.g. compact size and efficient heat dissipation) described above with respect to FIG. 13 can be achieved via sink 350. An additional advantage achieved using sink 350 is that less aluminum has to be used to form the sink and therefore sink 350 is less expensive. Nevertheless, one disadvantage of embodiment 350 is that large portions of conduit construct 352 are exposed and could easily be damaged (e.g. punctured).

To further protect construct 352, referring still to FIGS. 25 and 26, additional aft body members may be constructed and used to "sandwich" construct sections 362 and 364 between body members. For example, in FIGS. 25 and 26, an aft body member 386 is illustrated which includes a heat dissipating surface 388 which is grooved 390 so as to receive the second construct section aft side 371 opposite fore body member 356. Although not illustrated, a second aft body member similar to member 386 may be provided opposite body member 354 to sandwich first construct section 362 thereby protecting section 362.

Figure 27:
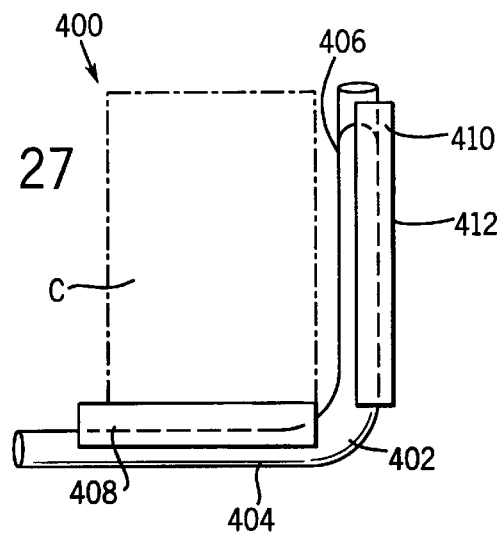
FIG. 27 is similar to FIG. 25, albeit illustrating another embodiment of the present invention.

Referring now to FIG. 27, yet another inventive sink 400 is illustrated. Sink 400 is similar to sink 350 in FIG. 25 in that it includes a conduit construct 402 which forms a serpentine path including first and second construct sections 404, 406, respectively, and also includes first and second body members 408 and 410, respectively. Referring to FIGS. 25 and 27, member 408 is essentially identical to member 354 and therefore is not explained here in detail. Member 410 is essentially identical to member 386 and is securely mounted to a surface of first construct section 406 opposite capacitor C. Body member 410 includes a device mounting surface 412 opposite capacitor C for mounting heat generating components (not illustrated). Thus, referring to FIGS. 13 and 27, all of the advantages associated with the sink of FIG. 13 are realized with sink 400.

Figure 28:
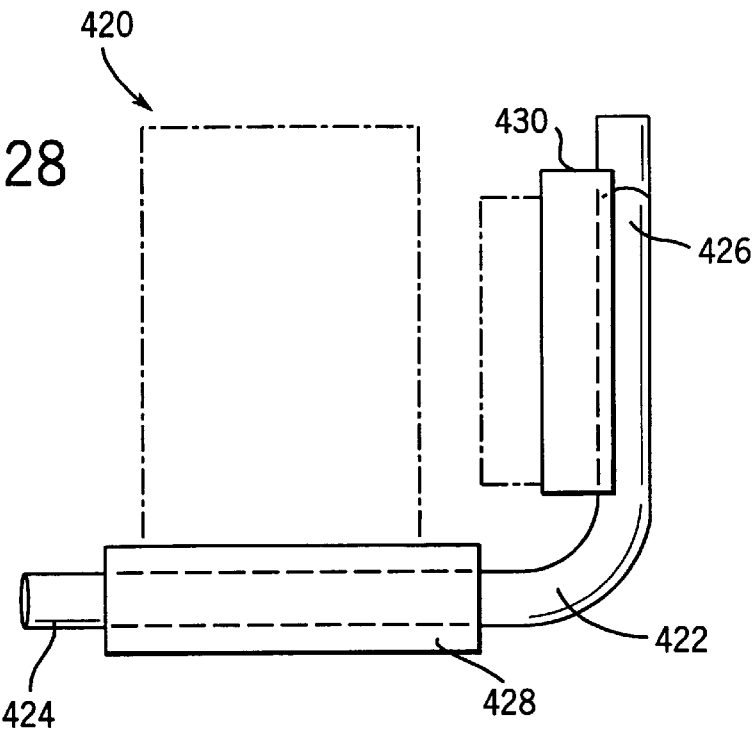
FIG. 28 is similar to FIG. 25, albeit illustrating one other embodiment of the present invention.

Referring now to FIG. 28, yet another inventive multi-planar sink 420 is illustrated. Sink 420 includes a conduit construct 422 including a first construct section 424 and a second construction section 426 which are arranged in a manner essentially identical to sink 350 of FIG. 25. Sink 420 also includes first and second body members 428, 430, respectively. Member 430 is essentially identical to member 356 in FIG. 25 and therefore will not be explained here in detail. Member 428, however, completely encases first construct section 424 and, preferably, would be formed using one of the inventive methods described above or below. Sink 420, provides all of the advantages of the sink illustrated in FIG. 13. In addition, sink 420 uses less body member material and therefore should be relatively less expensive.

Figure 29:
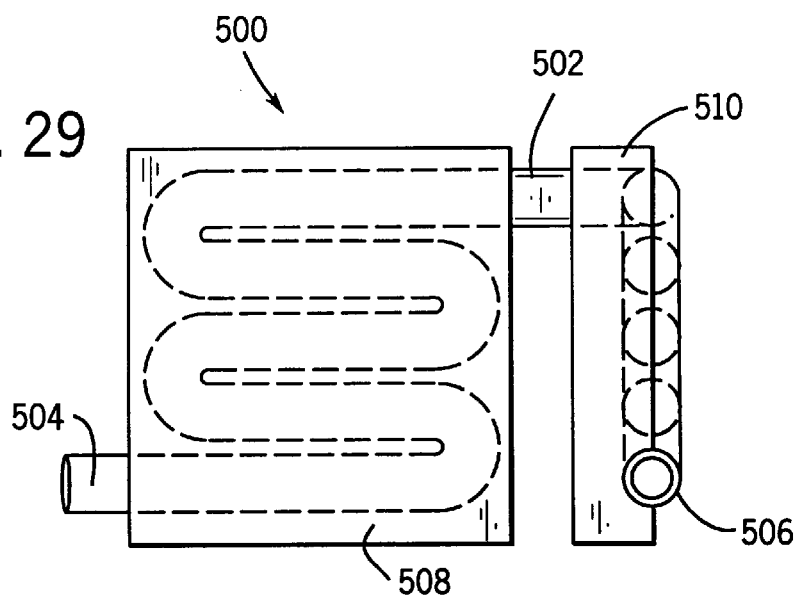
FIG. 29 is similar to FIG. 26, albeit illustrating another embodiment of the present invention.

Referring now to FIG. 29, yet another inventive sink 500 is illustrated. Referring also to FIG. 26, sink 500 is essentially identical to sink 350 except that the path formed by a conduit construct 502 is different. The path formed by construct 502 begins at an inlet 504, enters a first body member 508, forms a serpentine path with several bends in member 508 and then extends out of member 508 and into a second construct member 510, forms a path in construct section 510 which is similar to the path formed in construct section 508 and then exits section 510 at outlet 506. Sink 500 has all of the advantages of the sinks described above and, in addition, if designed properly, should require relatively less copper to form conduit construct 502.

The invention has been described with reference to the preferred embodiments. Obviously, modifications and alternations will occur to others upon reading and understanding the preceding detailed description. It is intended that the invention be construed as including all such modifications and alterations insofar as they come within the scope of appended claims or the equivalents thereof. For example, while the inventive sink is described as a sink including a cooling tube construction which includes a portion in each of at least two non-planar walls, the invention also contemplates a sink including at least two non-planar walls wherein the tube construction is in only one or a subset of construction walls.

In addition, while most of the embodiments described above are described as being formed using a copper conduit construct and body members for a body portion formed of aluminum, other metal combinations are contemplated including an aluminum conduit construct embedded in copper, a copper conduit construct embedded in copper, an aluminum conduit construct embedded in aluminum, a stainless steel conduit construct embedded in aluminum, any one of the embodiments above including either a copper alloy (e.g. hastelloy which is a copper-nickel compound), or an aluminum alloy instead of copper or aluminum, respectively, and so. In particular, in the case of a conduit construct wherein conduit sections are formed in at least two different planes, the inventive concept is that the conduit construct is formed in two planes, irrespective of the types of metals and/or the existence of or the type of barrier material used to form a heat sink.

Furthermore, referring to FIGS. 25–29, while conduit constructs in the illustrated embodiments form single serpentine paths, clearly, the body member configurations illustrated and described in FIGS. 25–28 could be used with a multi-path conduit construct which includes one or more manifolds or "T" sections. Also, while epoxy has been described above as a binding material for a conduit construct and a heat sink member, other thermosetting compounds such as polyesters, polyurethanes and silicons may be employed as binding materials.

To apprise the public of the scope of this invention, we make the following claims:

We claim:
1. An electronic brick assembly comprising:
   a conduit construct which forms a passageway between first and second construct ends, the construct formed such that construct portions reside in at least first and second different planes, construct portions which reside in the first plane referred to collectively as a first construct section and construct portions which reside in the second plane referred to collectively as a second construct section;
   at least one thermally conductive body member linked to the construct and forming at least one mounting surface for mounting electronic components; and
   at least one electronic component mounted to the mounting surface for dissipating heat.

2. The apparatus of claim 1 wherein the first construct section includes oppositely facing fore and aft sides and the body member is linked to the fore side of the first construct section.

3. The apparatus of claim 2 wherein the fore side defines a fore topology, the body member includes a heat dissipating surface which delimits the fore topology and, when the body member is linked to the fore side, the fore topology is received within the heat dissipating surface.

4. The apparatus of claim 1 wherein the first construct end is linked to the first construct section and the body member essentially encases the first construct section with the first end extending therefrom.

5. The apparatus of claim 4 wherein the first construct section includes oppositely facing fore and aft sides and the body member including fore and aft body members which are each linked to the fore and aft sides, respectively to sandwich the first construct section therebetween.

6. The apparatus of claim 5 wherein the fore and aft side external surfaces of the construct portions which constitute the first construct section define fore and aft topologies, respectively, each of the fore and aft body members form a heat dissipating surface and the heat dissipating surfaces delimit, when brought together on opposite sides of the first construct section, the fore and aft topologies, respectively.

7. The apparatus of claim 5 wherein the fore and aft body sections are secured to the first construct section by a thermosetting compound.

8. The apparatus of claim 5 wherein the fore and aft body sections are secured to each other via a thermosetting compound.

9. The apparatus of claim 4 wherein the body member is molded onto the first construct section.

10. The apparatus of claim 1 wherein the body member includes at least first and second body members and wherein the at least one mounting surface includes at least two mounting surfaces, the first body member linked to the first construct section and forming the first mounting surface and the second body member linked to the second construct section and forming the second mounting surface.

11. The apparatus of claim 10 wherein the first and second surfaces are perpendicular.

12. The apparatus of claim 10 wherein the first and second surfaces are parallel.

13. The apparatus of claim 10 wherein the first construct section includes oppositely facing first fore and first aft sides and the second construct section includes oppositely facing second fore and second aft sides, the first body member is a first fore member and is linked to the first fore side and the second body member is a second fore member and is linked the second fore side, the first fore side defines a first fore topology and the second fore side defines a second fore topology, the first fore member includes a first heat dissipating surface which delimits the first fore topology and the second fore member includes a second heat dissipating surface which delimits the second fore topology, when the first fore member is linked to the first side, the first fore topology is received within the first heat dissipating surface and, when the second fore member is linked to the second side, the second fore topology is received within the second heat dissipating surface.

14. The apparatus of claim 13 wherein the body members are linked to the construct via a thermosetting compound.

15. The apparatus of claim 10 wherein the first construct end is linked to the first construct section and the first body member encases the first construct section with the first end extending therefrom.

16. The apparatus of claim 15 wherein the first construct section includes oppositely facing fore and aft sides and the first body member includes fore and aft body members which are each linked to the fore and aft sides to sandwich the first construct section therebetween.

17. The apparatus of claim 16 wherein the fore and aft side external surfaces of the construct portions which constitute the first construct section define fore and aft topologies, respectively, each of the fore and aft body members form a heat dissipating surface and the heat dissipating surfaces delimit the fore and aft topologies, respectively, when brought together on opposite sides of the first construct section, the heat dissipating surfaces receiving the fore and aft topologies.

18. The apparatus of claim 15 wherein the the second construct end is linked to the second construct section and the second body member encases the second construct section with the second end extending there from.

19. The apparatus of claim 18 wherein the second construct section includes oppositely facing fore and aft sides and the second body member includes fore and aft body members which are each linked to the fore and aft sides to sandwich the second construct section therebetween.

20. The apparatus of claim 19 wherein the fore and aft side external surfaces of the construct portions which constitute the second construct section define fore and aft topologies, respectively, each of the fore and aft body members form a heat dissipating surface and the heat dissipating surfaces delimit the fore and aft topologies, respectively, when brought together on opposite sides of the second construct section, the heat dissipating surfaces receiving the fore and aft topologies.

21. The apparatus of claim 15 wherein the second construct section includes oppositely facing fore and aft sides and the second body member includes at least a fore body member having a dissipating surface and, wherein, the dissipating surface contacts the fore side when the fore body member is linked to the second construct section.

22. The apparatus of claim 21 wherein the fore side defines a fore topology, the fore body member includes a heat dissipating surface which delimits the fore topology and, when the fore body member is linked to the fore side, the fore topology is received within the heat dissipating surface.

23. The apparatus of claim 1 wherein the construct defines at least two passageways.

24. The apparatus of claim 1 wherein the first construct section includes at least one manifold which opens into a plurality of construct tubes which comprise the second construct section, the body section is a first body section and the apparatus further including at least a second body section, the second body section encasing the manifold.

25. The apparatus of claim 1 wherein the construct is formed of copper.

26. The apparatus of claim 1 wherein the body member is formed of aluminum.

27. The apparatus of claim 1 wherein the construct is formed of stainless steel.

28. The apparatus of claim 1 wherein the construct resides in more than two planes.

29. The apparatus of claim 1 wherein the construct is formed of a copper alloy.

30. The apparatus of claim 1 wherein the body member is formed of an aluminum alloy.

31. The apparatus of claim 1 wherein the construct is formed of steel.

32. An electronic brick assembly comprising:
a heat sink assembly including:
a metallic main body portion, the main body portion including at least a first wall member having first and second oppositely facing mounting surfaces;
an elongate conduit construction which forms a passageway between first and second construction ends, the construction disposed in the body portion, the first and second ends extending from the body portion; and
at least a first electronic device linked to the first first mounting surface and at least a second electronic device linked to the second mounting surface to facilitate device heat transfer to the wall.

33. The assembly of claim 32 wherein the first electronic device includes a first plurality of electronic devices and the second electronic device includes a second plurality of electronic devices.

34. The assembly of claim 33 wherein each device has a heat dissipating surface, each of the first plurality of devices is characterized by a long dimension perpendicular to a corresponding heat dissipating surface wherein the long dimensions are essentially identical and each of the second plurality of devices is characterized by a short dimension perpendicular to a corresponding heat dissipating surface wherein the short dimensions are essentially identical.

35. An electronic brick assembly comprising:
a heat sink assembly including:
a metallic main body portion, the main body portion including at least a first wall member and a second wall member which is linked to the first wall member, the first and second wall members linked such that the walls are disposed in first and second different planes, respectively;
a conduit construction which forms a passageway between first and second construction ends, the construction disposed in the body portion such that a portion of the construction is disposed in at least the first wall member, the first and second ends extending from the body portion; and
at least a first electronic device linked to the first wall member to facilitate device heat transfer to the first wall member.

* * * * *